(12) United States Patent
Tobita

(10) Patent No.: US 6,975,168 B2
(45) Date of Patent: Dec. 13, 2005

(54) DRIVE CIRCUIT

(75) Inventor: Youichi Tobita, Hyogo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/500,219

(22) PCT Filed: Nov. 26, 2002

(86) PCT No.: PCT/JP02/12342

§ 371 (c)(1),
(2), (4) Date: Jun. 25, 2004

(87) PCT Pub. No.: WO2004/049562

PCT Pub. Date: Jun. 10, 2004

(65) Prior Publication Data

US 2004/0256636 A1 Dec. 23, 2004

(51) Int. Cl.[7] .............................................. H03F 3/45
(52) U.S. Cl. ........................... 330/253; 330/261
(58) Field of Search ................................ 330/253, 261, 330/257, 9; 327/359

(56) References Cited

U.S. PATENT DOCUMENTS 5,907,259 A * 5/1999 Yamada et al. ............. 327/563
6,066,985 A * 5/2000 Xu ............................. 330/253
6,759,903 B2 * 7/2004 Horimoto .................... 330/253

FOREIGN PATENT DOCUMENTS

| JP | 3-139908 A | 6/1991 |
| JP | 4-215315 A | 8/1992 |
| JP | 5-29840 | 2/1993 |
| JP | 7-142940 A | 6/1995 |
| JP | 9-219636 | 8/1997 |
| JP | 315454 | 9/1997 |
| JP | 9-260969 A | 10/1997 |
| JP | 2002-123326 A | 4/2002 |
| JP | 2002-290172 A | 10/2002 |
| TW | 315454 | 9/1997 |

* cited by examiner

Primary Examiner—Henry Choe
(74) Attorney, Agent, or Firm—McDermott Will & Emery LLP

(57) ABSTRACT

The present drive circuit includes: a first N-type transistor connected between a power supply potential line and an output node; a P-type transistor connected between the power supply potential line and the gate of the first N-type transistor; a second N-type transistor forming a diode connected between the gate of the first N-type transistor and a prescribed node; and a differential amplifier for regulating the gate potential of the P-type transistor to match the potential at the prescribed node with the input potential.

14 Claims, 20 Drawing Sheets

130

US 6,975,168 B2

DRIVE CIRCUIT

TECHNICAL FIELD

The present invention relates to a drive circuit, and more particularly, to a drive circuit in which an electric potential corresponding to an input potential is output to an output node.

BACKGROUND ART

FIG. 22 is a circuit diagram illustrating the structure of a conventional drive circuit 130. In FIG. 22, drive circuit 130 includes a differential amplifier 131, a P-type field-effect transistor (hereinafter referred to as a P-type transistor) 132 and a constant-current circuit 133. P-type transistor 132 is connected between a power supply potential VDD line and an output node N132. Constant current circuit 133 allows a constant current to flow from output node N132 to a ground potential GND line. Differential amplifier 131 has a non-inverting input terminal receiving the potential VI at an input node N131, an inverting input terminal receiving the potential VO at output node N132, and an output terminal connected to the gate of P-type transistor 132.

When the output potential VO is higher than the input potential VI, the output potential of differential amplifier 131 is increased, the electric current flowing into P-type transistor 132 is decreased, and the output potential VO is decreased. When the output potential VO is lower than the input potential VI, the output potential of differential amplifier 131 is reduced, the current flowing into P-type transistor 132 is increased, and the output potential VO is increased. Thus, VO=VI.

Unfortunately, since conventional drive circuit 130 has a direct feedback from the output potential VO to differential amplifier 131, the load capacitance may vary when it is large, or oscillation may occur when the input potential VI varies.

DISCLOSURE OF THE INVENTION

A main object of the present invention, therefore, is to provide a drive circuit with reduced oscillation occurring.

The drive circuit according to the present invention is a drive circuit for outputting a potential, corresponding to an input potential, to an output node, including: a first transistor connected between a first power supply potential line and an output node; a second transistor having a gate and a first electrode connected to the gate of the first transistor, and a second electrode connected to a first node; a third transistor connected in series with the second transistor between second and third power supply potential lines; a first differential amplifier for regulating the gate potential of the third transistor to match the potential at the first node with the input potential. Consequently, the capacitance of the first node is sufficiently small compared with the load capacitance connected to the output node, thereby minimizing oscillation occurring.

BEST MODES FOR CARRYING OUT THE INVENTION

[First Embodiment]

Figure 1:
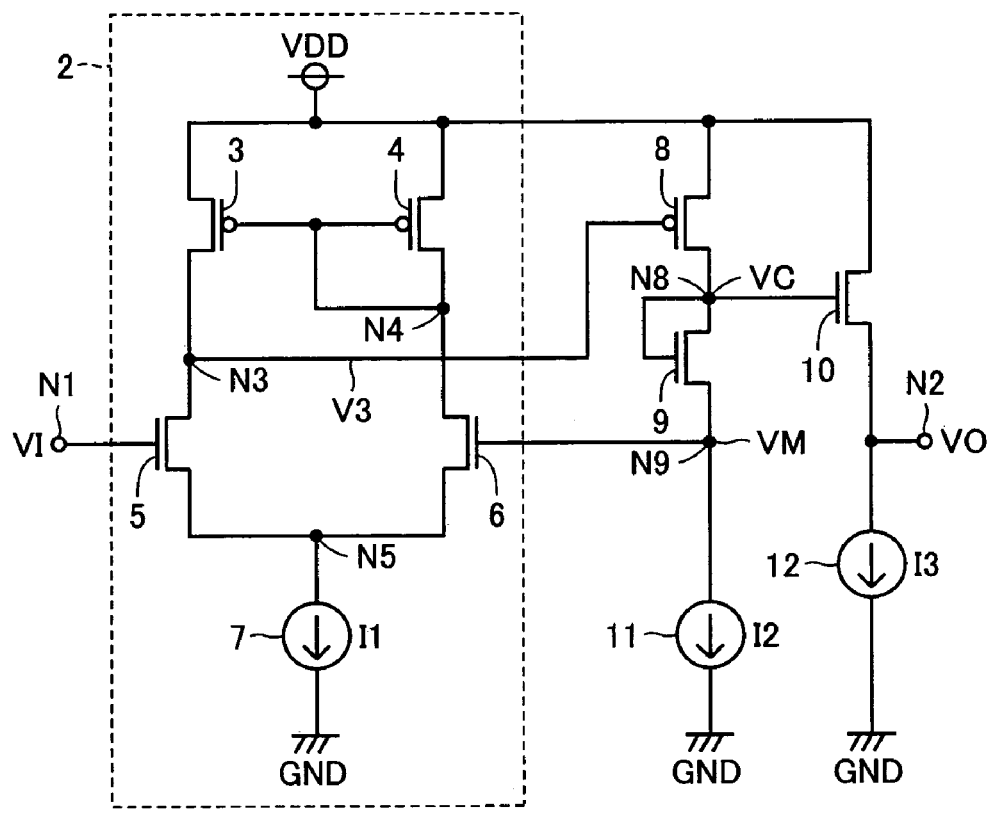
FIG. 1 is a circuit diagram showing the structure of a push type drive circuit according to a first embodiment of the present invention.

FIG. 1 is a circuit diagram showing the structure of a push type drive circuit 1 according to a first embodiment of the present invention. In FIG. 1, drive circuit 1 includes a differential amplifier 2, a P-type transistor 8, N-type field-effect transistors (hereinafter referred to as N-type transistors) 9 and 10, and constant current circuits 11 and 12.

Differential amplifier 2 includes P-type transistors 3 and 4, N-type transistors 5 and 6, and a constant current circuit 7. P-type transistors 3 and 4 are connected between a power supply potential VDD line and respective nodes N3 and N4, and have their gates commonly connected to node N4. P-type transistors 3 and 4 form a current mirror circuit. N-type transistors 5 and 6 are connected between respective nodes N3 and N4, and node N5, and have their gates receiving the potential VI at input node N1 and the potential VM at node N9, respectively. Constant current circuit 7 is connected between node N5 and a ground potential GND line and allows a constant current I1 with a prescribed value to flow from node N5 to the ground potential GND line.

P-type transistor 8, N-type transistor 9 and constant current circuit 11 are connected in series between the power supply potential VDD line and a ground potential GND line. P-type transistor 8 has its gate receiving the potential V3 at output node N3 in differential amplifier 2. The gate of N-type transistor 9 is connected to its drain. N-type transistor 9 forms a diode. Constant current circuit 11 allows a constant-current I2 with a prescribed value to flow from node N9 to the ground potential GND line. The potential VM of the source of N-type transistor 9 (at node N9) is supplied to the gate of N-type transistor 6. N-type transistor 10 is connected between the power supply potential VDD line and output node N2 of drive circuit 1 and has its gate receiving the potential VC at node N8 between transistors 8 and 9. Constant current circuit 12 is connected between output node N2 and a ground potential GND line, allowing a constant current I3 with a prescribed value to flow from output node N2 to the ground potential GND line.

The operation of above drive circuit 1 will now be described. In drive circuit 1, differential amplifier 2 operates to render the potential VM at node N9 equal to the potential at input node N1. More specifically, N-type transistor 6 and P-type transistor 4 are connected in series to each other, and P-type transistors 3 and 4 form a current mirror circuit, such that a current with a value corresponding to the monitor potential VM flows into P-type transistor 3.

When the monitor potential VM is higher than the input potential VI, the current flowing into P-type transistor 3 becomes larger than the current flowing into N-type transistor 5, increasing the potential V3 at node N3. This reduces the current flowing into P-type transistor 8, thereby reducing the monitor potential VM. When the monitor potential VM is smaller than the input potential VI, the current flowing into P-type transistor 3 becomes smaller than the current flowing into the N-type transistor 5, reducing the potential V3 at node N3. This allows larger current to flow into P-type transistor 8, increasing the monitor potential VM. Thus, VM=VI.

The current I2 in constant current circuit 11 is set to a sufficiently small value to produce a potential VC at node N8 that satisfies: VC=VM+VTN, where VTN is the threshold voltage of the N-type transistors. Further, the current driving capacity of N-type transistor 10 is sufficiently larger than that of constant current circuit 12 such that N-type transistor 10 operates as a source follower to produce a potential VO at output node N2 that satisfies: VO=VC−VTN=VM=VI. This provides an output potential VO that is equal to the input potential VI.

Now, the relationship between N-type transistors 9, 10 and the currents I2; I3 in constant current circuits 11, 12 will be described below in more detail. When the current amplification coefficients of N-type transistors 9 and 10 are β9 and β10, respectively, the relationship between N-type transistors 9, 10 and the currents I2, I3 in constant current circuits 11, 12 is given by the equations:

$$I2=\beta 9(VC-VM-VTN)^2/2 \tag{1), and}$$

$$I3=\beta 10(VC-VO-VTN)^2/2 \tag{2).}$$

Suppose that VM (=VI)=VO, the equation (1) gives the equation:

$$I2=\beta 9(VC-VO-VTN)^2/2 \tag{3).}$$

Further, the equations (3) and (2) give the equation:

$$I2/I3=\beta 9/\beta 10 \tag{4).}$$

In short, I2, I3, β9, and β10 are set to satisfy the equation (4) to achieve VI=VO.

In the first embodiment, the capacitance in the feedback loop to differential amplifier 2 is the total gate capacitance of N-type transistors 6, 9 and 10, such that the capacitance in the feedback loop to differential amplifier 2 is significantly small compared with the conventional implementation where the load capacitance was directly connected with differential amplifier 131. Thus, oscillation is prevented from occurring in drive circuit 1.

It should be noted that each of field-effect transistors 3 to 6 and 8 to 10 may be a MOS transistor or a thin film transistor (TFT). A thin film transistor may be formed of any semiconductor thin film, such as a polysilicon thin film, amorphous silicon thin film or the like, and may be formed on any insulating substrate, such as a resin substrate, glass substrate or the like.

Figure 2A:
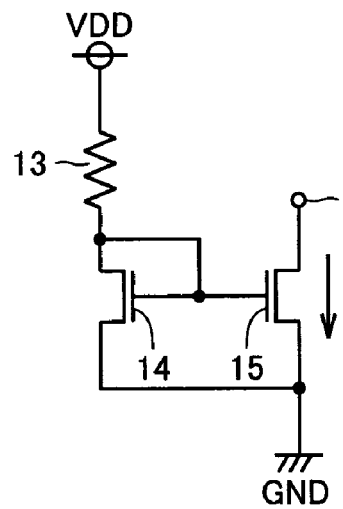
FIGS. 2A to 2C are circuit diagrams illustrating the structure of a constant current circuit shown in FIG. 1.
Figure 2B:
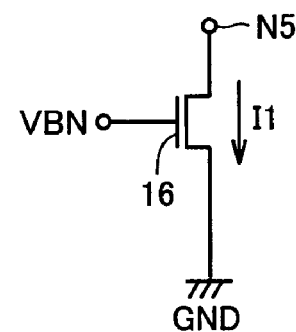
Figure 2C:
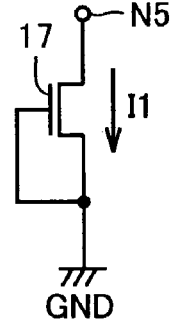

FIGS. 2A to 2C are circuit diagrams illustrating the structure of constant current circuit 7 shown in FIG. 1. In FIG. 2A, constant current circuit 7 includes a resistor 13 and N-type transistors 14 and 15. Resistor 13 and N-type transistor 14 are connected in series between the power supply potential VDD line and the ground potential GND line, and N-type transistor 15 is connected between node N5 and the ground potential GND line. N-type transistors 14, 15 have their gates commonly connected to the drain of N-type transistor 14. N-type transistors 14 and 15 form a current mirror circuit. A constant current with a value corresponding to the resistance value of resistor 13 flows into resistor 13 and N-type transistor 14. A constant current I1 with a value corresponding to the current flowing into N-type transistor 14 flows into N-type transistor 15.

In FIG. 2B, constant current circuit 7 includes an N-type transistor 16. N-type transistor 16 is connected between node N5 and the ground potential GND line and has its gate receiving a constant bias potential VBN. The bias potential VBN is set to a prescribed level that causes N-type transistor 16 to be operated in a saturation region. Thus, a constant current I1 flows into N-type transistor 16.

In FIG. 2C, constant current circuit 7 includes a depletion-type N-type transistor 17. N-type transistor 17 is connected between node N5 and the ground potential GND line, and has a gate connected to the ground potential GND line. N-type transistor 17 is provided to allow a constant current I1 to flow therethrough even when its gate-source voltage is at 0 Volt. Constant current circuit 11 may have the same structure as constant current circuit 7, or may be formed of a resistance element that allows the current I2 to flow therethrough. Similarly, constant current circuit 12 may have the same structure as constant current circuit 7, or may be formed of a resistance element that allows the current I3 to flow therethrough.

Figure 3:
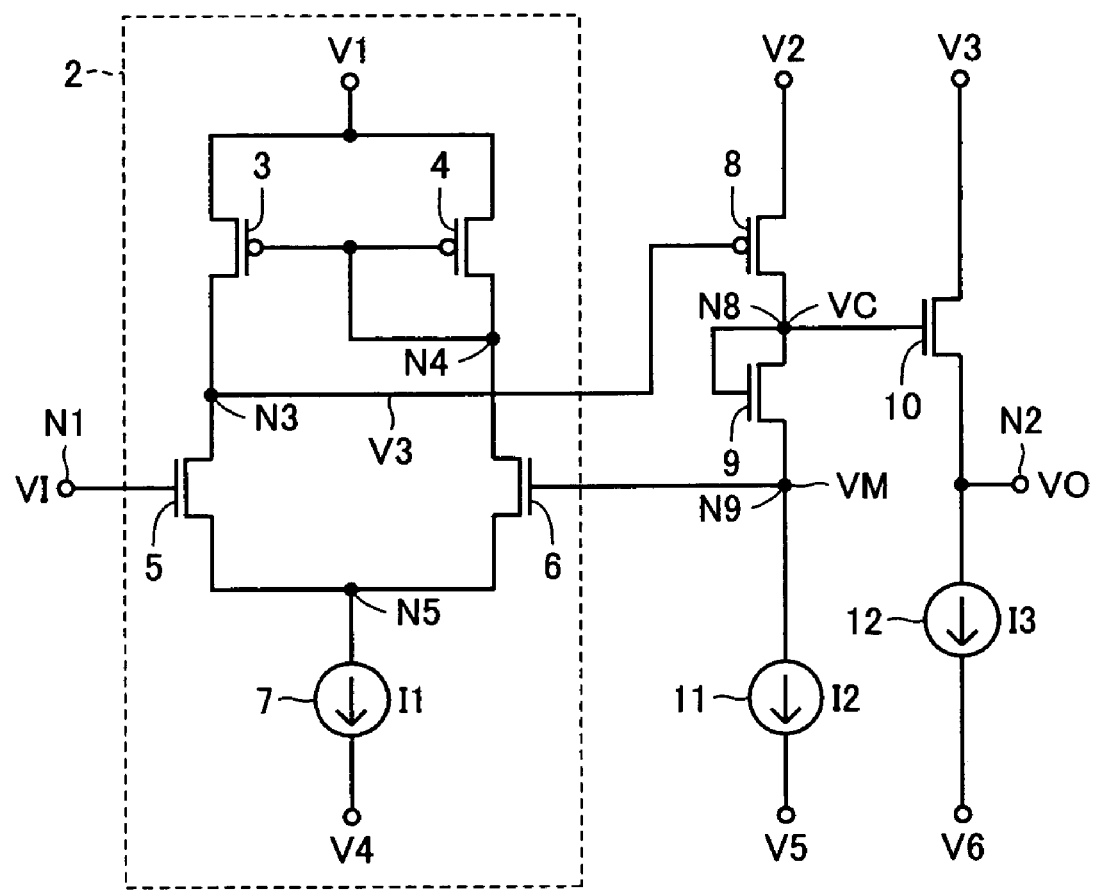
FIG. 3 is a circuit diagram showing a modification of the first embodiment.

In drive circuit 18 of FIG. 3, power supply potentials V1, V2 and V3 that are different from each other are supplied to the sources of P-type transistors 3, 4, the source of P-type transistor 8, and the drain of N-type transistor 10, respectively. Further, the low potential terminals of constant current circuits 7, 11 and 12 are connected to the respective power supply potentials V4, V5 and V6 that are different from each other. This variation also provides the same effect as drive circuit 1 of FIG. 1.

Figure 4:
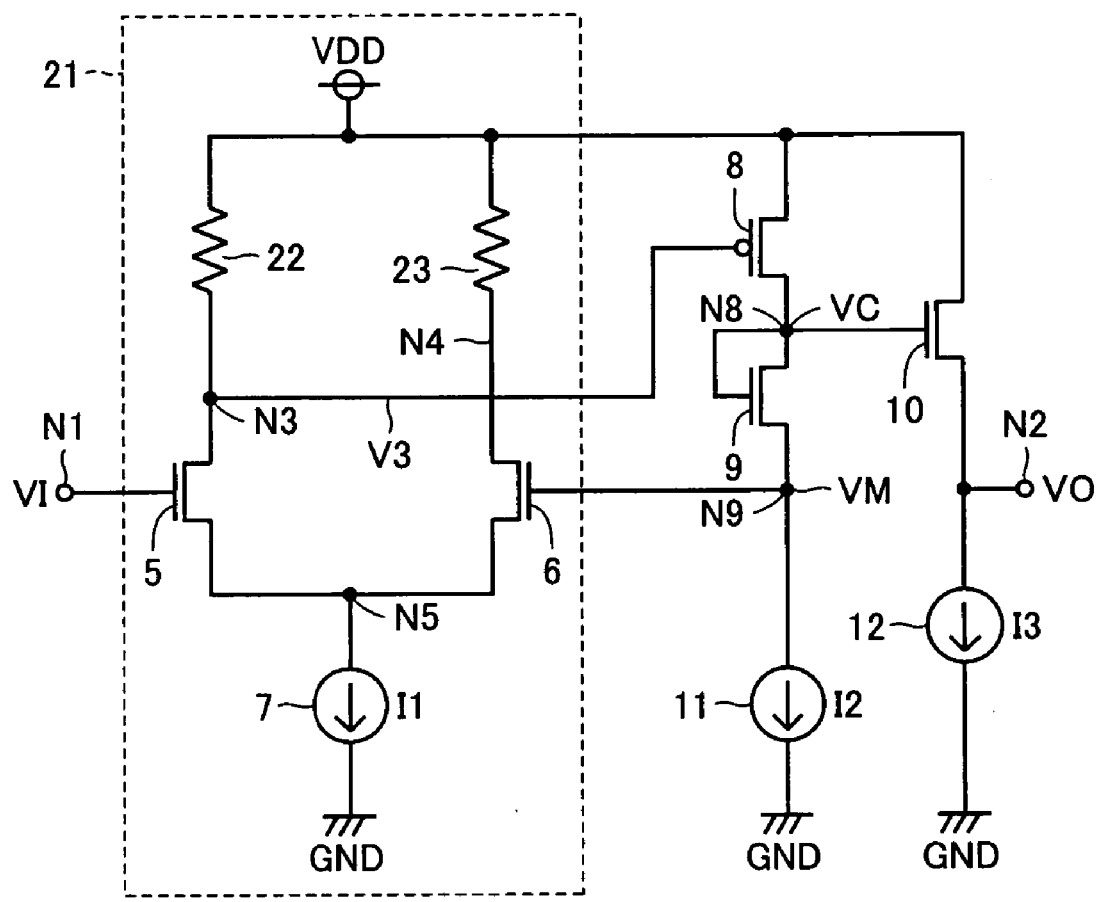
FIG. 4 is a circuit diagram showing another modification of the first embodiment.

Drive circuit 20 of FIG. 4 has a differential amplifier 21 substituted for differential amplifier 2 of drive circuit 1 in FIG. 1. Differential amplifier 21 has resistors 22 and 23 substituted for P-type transistors 3 and 4, respectively, of differential amplifier 2. Resistors 22 and 23 are connected between the power supply potential VDD line and nodes N3 and N4, respectively.

The sum of the current flowing into N-type transistor 5 and the current flowing into N-type transistor 6 is equal to the current I1 flowing into constant current circuit 7. When the monitor potential VM is equal to the input potential VI, the current flowing into N-type transistor 5 is equal to the current flowing into N-type transistor 6. When the monitor potential VM is higher than the input potential VI, the current in N-type transistor 6 is increased while the current in N-type transistor 5 is decreased, such that the potential V3 at node N3 is increased, thereby reducing the current in P-type transistor 8, which in turn reduces the monitor potential VM. When the monitor potential VM is lower than the input potential VI, the current in N-type transistor 6 is decreased while the current in N-type transistor 5 is increased, such that the potential V3 at node N3 is reduced, thereby increasing the current in P-type transistor 8, which in turn increases the monitor potential VM. Consequently, the monitor potential VM is maintained at the same level as the input potential VI, thus achieving VO=VI. This variation also provides the same effect as drive circuit 1 of FIG. 1.

[Second Embodiment]

Figure 5:
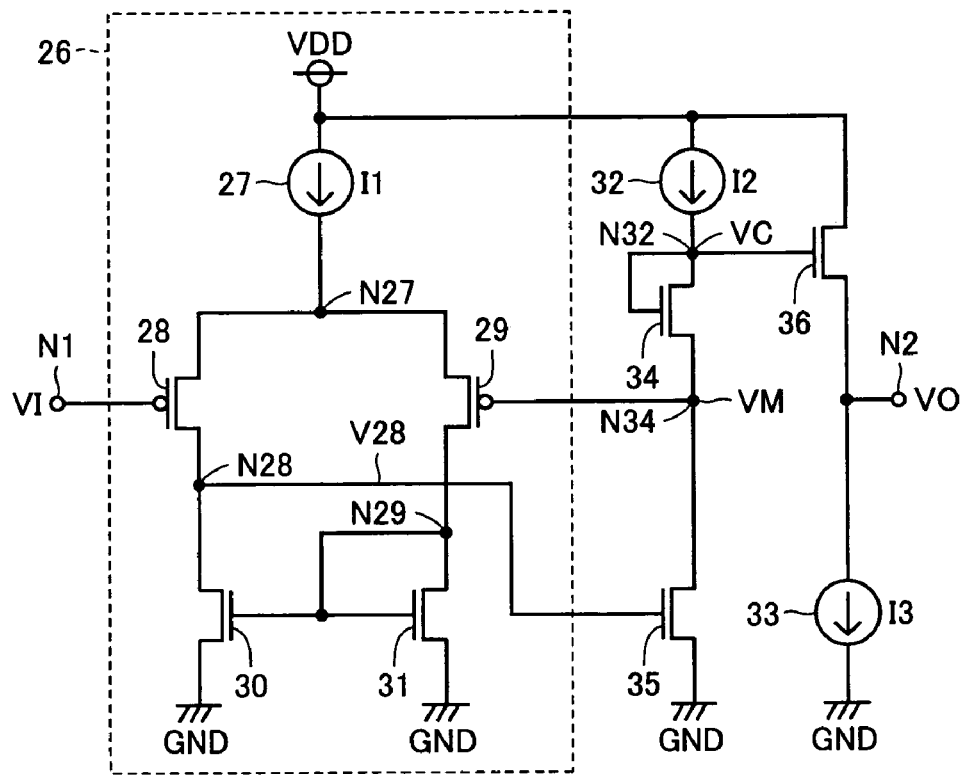
FIG. 5 is a circuit diagram showing the structure of a push type drive circuit according to a second embodiment of the present invention.

FIG. 5 is a circuit diagram illustrating the structure of a push-type drive circuit 25 according to a second embodiment of the present invention. In FIG. 5, drive circuit 25 includes a differential amplifier 26, constant current circuits 32, 33 and N-type transistors 34 to 36.

Differential amplifier 26 includes a constant current circuit 27, P-type transistors 28, 29 and N-type transistors 30, 31. Constant current circuit 27 is connected between the power supply potential VDD line and node N27, and allows a constant current I1 with a prescribed value to flow from the power supply potential VDD line to node N27. P-type transistors 28 and 29 are connected between node N27 and respective nodes N28 and N29, and have their gates receiving the input potential VI and the monitor potential VM, respectively. N-type transistors 30 and 31 are connected between respective nodes N28 and N29 and respective ground potential GND lines, and have their gates commonly connected to node N29. N-type transistors 30 and 31 form a current mirror circuit.

Constant current circuit 32 and N-type transistors 34 and 35 are connected in series between the power supply potential VDD line and a ground potential GND line. Constant current circuit 32 allows a constant current I2 with a prescribed value to flow from the power supply potential VDD line to node N32. N-type transistor 34 has its gate connected to its drain (node N32). N-type transistor 34 forms a diode. The potential at node N34 between N-type transistors 34 and 35 defines the monitor potential VM. The gate of N-type transistor 35 receives the potential V28 at output node N28 in differential amplifier 26. N-type transistor 36 is connected between the power supply potential VDD line and output node N2, and has its gate receiving the potential VC at node N32. Constant current circuit 33 is connected between output node N2 and a ground potential GND line, and allows a constant current I3 with a prescribed value to flow from output node N2 to the ground potential GND line.

The operation of above drive circuit 25 will now be described. In drive circuit 25, differential amplifier 26 operates to render the monitor potential VM equal to the input potential VI. More specifically, P-type transistor 29 and N-type transistor 31 are connected in series and N-type transistors 30 and 31 form a current mirror circuit, such that a current with a value corresponding to the monitor potential VM flows into N-type transistor 30.

When the monitor potential VM is higher than the input potential VI, the current flowing into N-type transistor 30 becomes smaller than the current flowing into P-type transistor 29, thereby increasing the potential V28 at node N28. Thus, the current flowing into N-type transistor 35 is increased and the monitor potential VM is decreased. When the monitor potential VM is lower than the input potential VI, the current flowing into N-type transistor 30 becomes larger than the current flowing into P-type transistor 28 and the potential V28 at node N28 is reduced. Thus, the current flowing into MOS transistor 35 is reduced, thereby increasing the monitor potential VM. This results in VM=VI.

The current I2 in constant current circuit 32 is set to a sufficiently small value to produce a potential VC at node N32 that satisfies: VC=VM+VTN. Also, the current driving capacity of N-type transistor 36 is sufficiently larger than that of constant current circuit 33 to cause the N-type transistor to operate as a source follower to produce a potential VO at output node N2 that satisfies: VO=VC−VTN=VM=VI. This provides an output potential VO at the same level as the input potential VI.

In the second embodiment, the capacitance in the feedback loop to differential amplifier 26 is the total gate capacitance of transistors 29, 34 and 36, such that the capacitance in the feedback loop to differential amplifier 26 is sufficiently small compared with the conventional implementation where the load capacitance was directly connected with differential amplifier 131. Thus, oscillation is prevented from occurring in drive circuit 25.

Figure 6A:
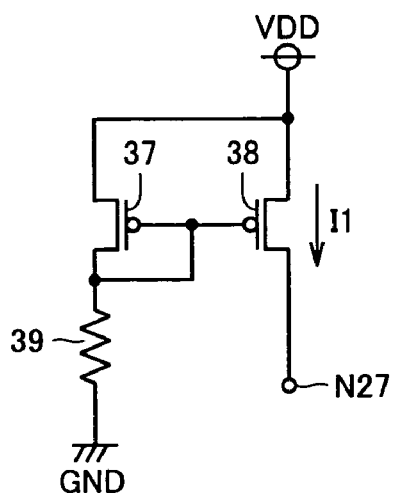
FIGS. 6A to 6C are circuit diagrams illustrating the structure of a constant current circuit shown in FIG. 5.
Figure 6B:
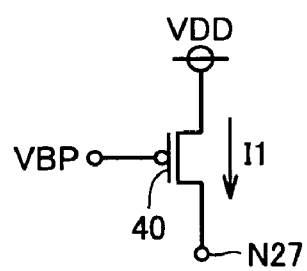
Figure 6C:
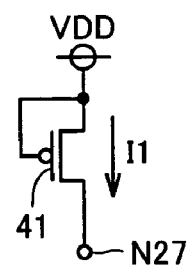

FIGS. 6A to 6C are circuit diagrams illustrating the structure of constant current circuit 27 shown in FIG. 5. In FIG. 6A, constant current circuit 27 includes P-type transistors 37, 38 and a resistor 39. P-type transistor 37 and resistor 39 are connected in series between the power supply potential VDD line and the ground potential GND line, and P-type transistor 38 is connected between the power supply potential VDD line and node N27. P-type transistors 37 and 38 have their gates commonly connected to the drain of P-type transistor 37. P-type transistors 37 and 38 form a current mirror circuit. A constant current with a value corresponding to the resistance value of resistor 39 flows into P-type transistor 37 and resistor 39. A constant current I1 with a value corresponding to the current flowing into P-type transistor 37 flows into P-type transistor 38.

In FIG. 6B, constant current circuit 27 includes a P-type transistor 40. P-type transistor 40 is connected between the power supply potential VDD line and node N27, and has its gate receiving a constant bias potential VBP. The bias potential VBP is set to a prescribed level that causes P-type transistor 40 to be operated in a saturation region. Thus, a constant value I1 flows into P-type transistor 40.

In FIG. 6C, constant current circuit 27 includes a depletion-type P-type transistor 41. P-type transistor 41 is connected between the power supply potential VDD line and node N27, and has its gate connected to the power supply potential VDD line. P-type transistor 41 is provided to allow a constant current I1 to flow therethrough even when the gate-source voltage is at 0 Volt. Constant current circuit 32 may have the same structure as constant current circuit 27, or may be formed of a resistance element that allows the current I2 to flow therethrough.

Figure 7:
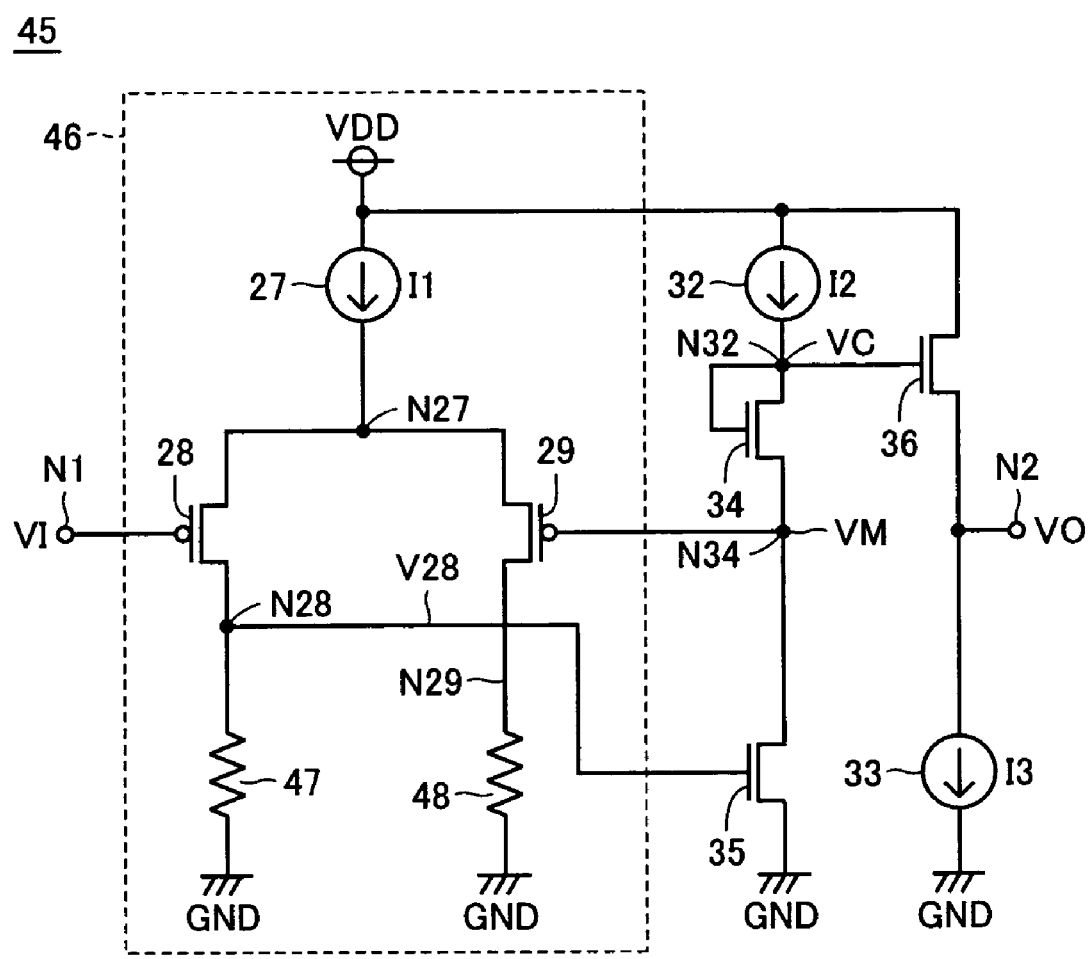
FIG. 7 is a circuit diagram showing a modification of the second embodiment.

Drive circuit 45 of FIG. 7 has a differential amplifier 46 substituted for differential amplifier 26 of drive circuit 25 in FIG. 5. Differential amplifier 46 has resistors 47 and 48 substituted for N-type transistors 30 and 31, respectively, of differential amplifier 26. Resistors 47 and 48 are connected between respective nodes, N28 and N29, and ground potential GND. The sum of the current flowing into P-type transistor 28 and the current flowing into P-type transistor 29 is equal to the current I1 flowing into constant current circuit 27. When the monitor potential VM is equal to the input potential VI, the current in P-type transistor 28 is equal to the current in P-type transistor 29. When the monitor potential VM is higher than the input potential VI, the current in P-type transistor 29 is reduced while the current in P-type transistor 28 is increased such that the potential V28 at node N28 is increased, thereby increasing the current in N-type transistor 35, reducing the monitor potential VM. When the monitor potential VM is lower than the input potential VI, the current in P-type transistor 29 is increased while the current in P-type transistor 28 is decreased such that the potential V28 at node N28 is reduced, thereby reducing the current in N-type transistor 35, increasing the monitor potential VM. Thus, the monitor potential VM is maintained at the input potential VI, thus achieving VO=VI. This variation provides the same effect as drive circuit 1 of FIG. 1.

Figure 8:
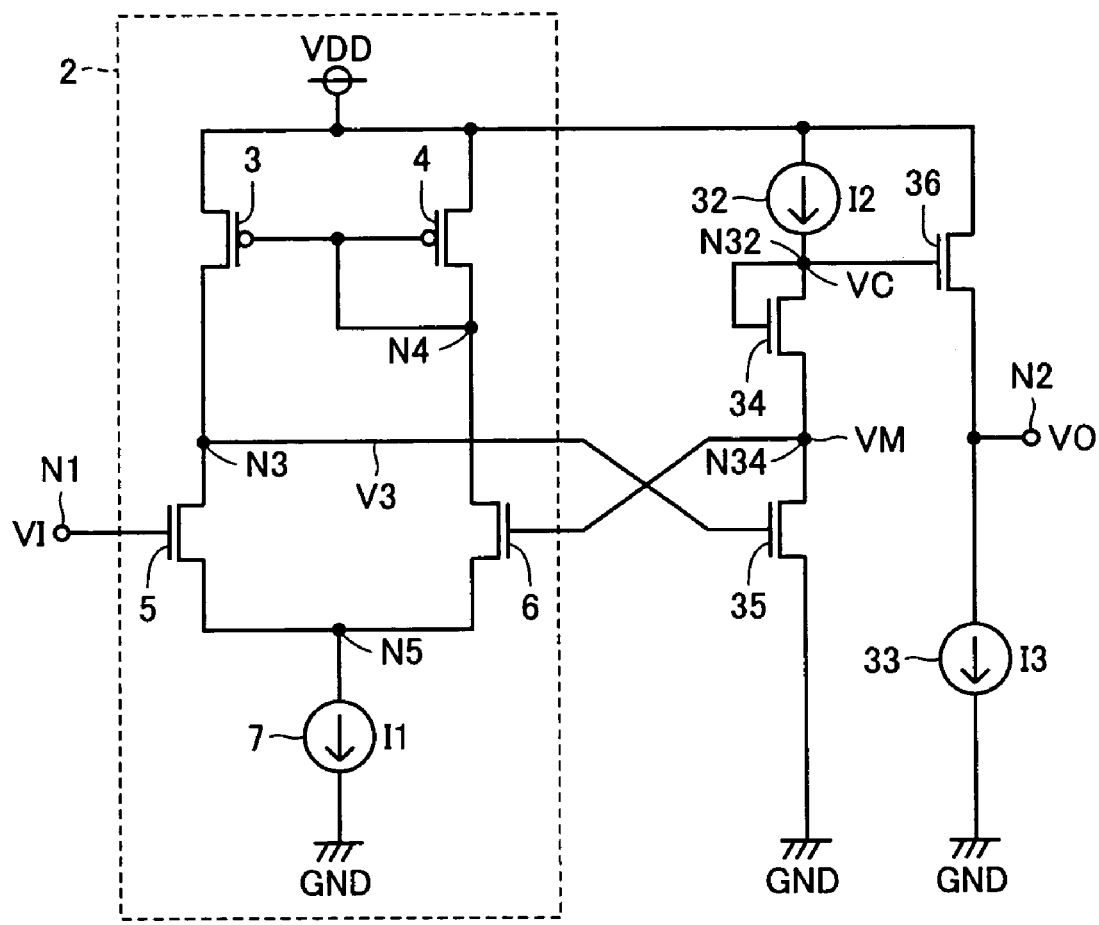
FIG. 8 is a circuit diagram showing another modification of the second embodiment.

Drive circuit 50 in FIG. 8 has differential amplifier 2 of FIG. 1 substituted for differential amplifier 26 of drive circuit 25 of FIG. 5. N-type transistor 35 has its gate receiving the potential V3 at node N3, while N-type transistor 6 has its gate receiving the monitor potential VM. When the monitor potential VM is higher than the input potential VI, the current flowing into P-type transistor 3 becomes larger than the current flowing into P-type transistor 5, which increases the potential V3 at node N3, such that the current in N-type transistor 35 is increased, thereby reducing the monitor potential VM. When the monitor potential VM is lower than the input potential VI, the current flowing into P-type transistor 3 becomes smaller than the current flowing into N-type transistor 5, which reduces the potential V3 at node N3, such that the current in N-type transistor 35 is decreased, thereby increasing the monitor potential VM. Thus, VM=VI and therefore VO=VI. This variation also provides the same effect as drive circuit 25 in FIG. 5.

[Third Embodiment]

Figure 9:
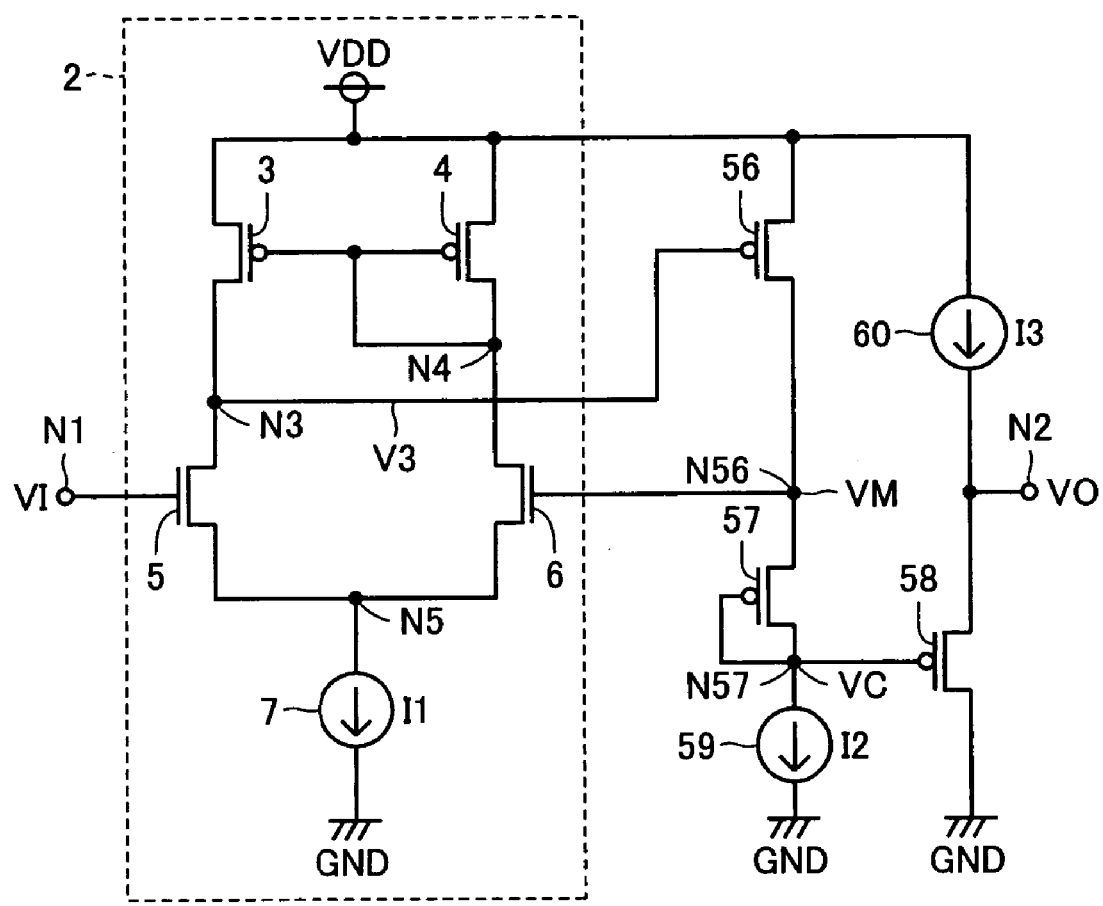
FIG. 9 is a circuit diagram showing the structure of a pull type drive circuit according to a third embodiment of the present invention.

FIG. 9 is a circuit diagram showing the structure of a pull type drive circuit 55 according to a third embodiment of the present invention. In FIG. 9, drive circuit 55 includes a differential amplifier 2, P-type transistors 56 to 58 and constant current circuits 59, 60. Differential amplifier 2 is the same as in FIG. 1. P-type transistors 56, 57 and constant current circuit 59 are connected in series between the power supply potential VDD line and a ground potential GND line. P-type transistor 56 has its gate receiving the potential V3 at node N3. N-type transistor 6 has its gate receiving the potential VM at node N56 between P-type transistors 56 and 57. P-type transistor 57 has its gate connected to its drain (node N57). P-type transistor 57 forms a diode. Constant current circuit 59 allows a constant current I2 with a prescribed value to flow from node N57 to the ground potential GND line. Constant current circuit 60 allows a constant current I3 with a prescribed value from the power supply potential VDD line to output node N2. P-type transistor 58 is connected between output node N2 and a ground potential GND line and has its gate receiving the potential VC at node N57.

The monitor potential VM is maintained at the input potential VI by means of the operation of differential amplifier 2. The current driving capacity of P-type transistor 57 is sufficiently larger than the constant current I2 in constant current circuit 59 to produce a potential VC at node N57 that satisfies: VC=VM−|VTP|, where VTP is the threshold voltage of the P-type transistors. The current driving capacity of P-type transistor 58 is sufficiently larger than the constant current I3 in constant current circuit 60 to produce an output potential VO that satisfies: VO=VC+|VTP|=VM−|VTM|+|VTP|=VM=VI.

In the third embodiment, the capacitance in the feedback loop to differential amplifier 2 is the total gate capacitance of transistors 6, 57 and 58, such that the capacitance in the feedback loop to differential amplifier 2 is sufficiently small compared to the conventional implementation where the load capacitance was directly connected with differential amplifier 131. Thus, oscillation is prevented from occurring in drive circuit 55.

Figure 10:
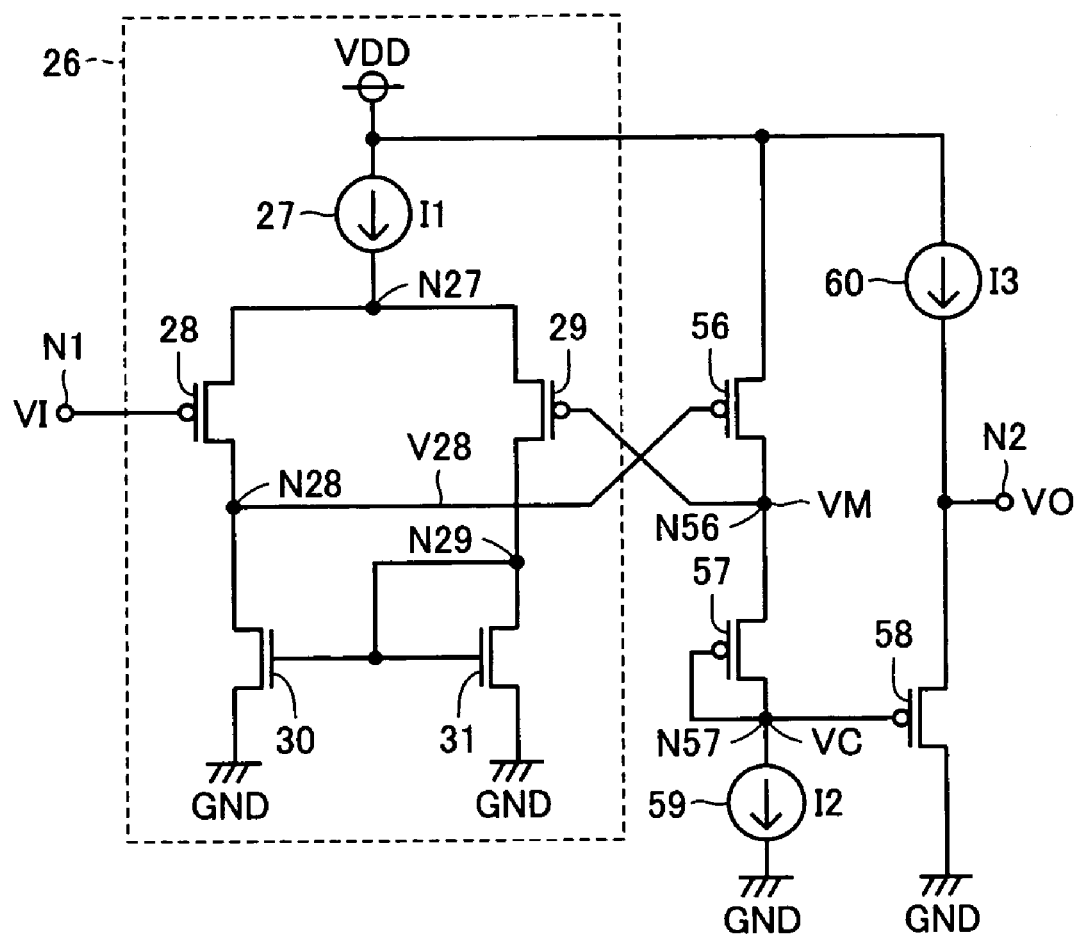
FIG. 10 is a circuit diagram showing a modification of the third embodiment.

Drive circuit 61 of FIG. 10 has differential amplifier 26 substituted for differential amplifier 2 of drive circuit 55 in FIG. 9. P-type transistor 56 has its gate receiving the potential V28 at node N28. P-type transistor 29 has its gate receiving the monitor potential VM. When the monitor potential VM is higher than the input potential VI, the current in N-type transistor 30 becomes smaller than the current in P-type transistor 28, which increases potential V28 at node N28, such that the current flowing through P-type transistor 56 is decreased, reducing the monitor potential VM. When the monitor potential VM is lower than the input potential VI, the current in N-type transistor 30 becomes larger than the current in P-type transistor 28, which reduces the potential V28 at node N28, such that the current flowing through P-type transistor 56 is increased, thereby increasing the monitor potential VM. Thus, VM=VI and therefore VO=VI. This variation also provides the same effect as drive circuit 55 in FIG. 9.

Figure 11:
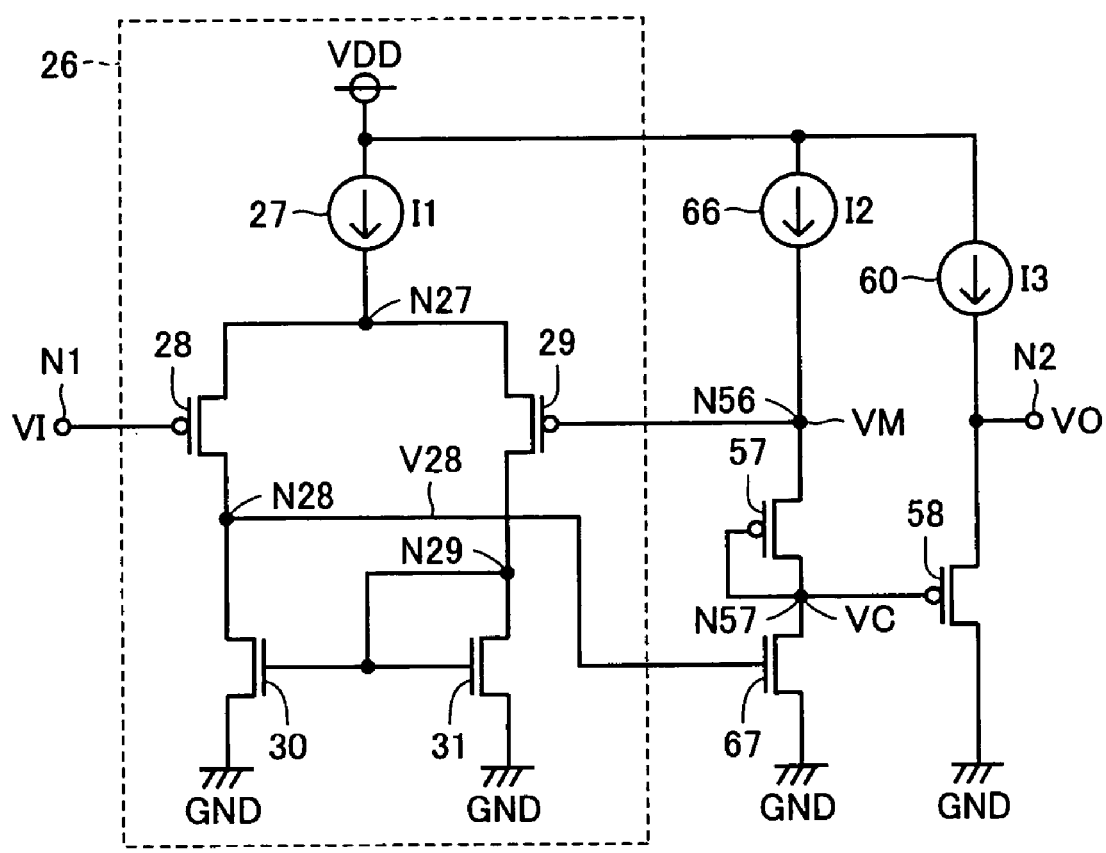
FIG. 11 is a circuit diagram showing another modification of the third embodiment.

Drive circuit 65 in FIG. 11 has a constant current circuit 66 and an N-type transistor 67 substituted for P-type transistor 56 and constant current circuit 59, respectively, of drive circuit 61 in FIG. 10. Constant current circuit 66 allows a constant current I2 with a prescribed value to flow from the power supply potential VDD line to node N56. N-type transistor 67 is connected between node N57 and a ground potential GND line and has its gate receiving the potential V28 at node N28. When the monitor potential VM is higher than the input potential VI, the potential V28 at node N28 is increased, which increases the current flowing into N-type transistor 67, reducing the monitor potential VM. When the monitor potential VM is lower than the input potential VI, the potential V28 at node N28 is reduced, which reduces the current flowing into N-type transistor 67, increasing the monitor potential VM. Thus, VM=VI and therefore VO=VI. This variation also provides the same effect as drive circuit 55 of FIG. 9.

[Fourth Embodiment]

Figure 12:
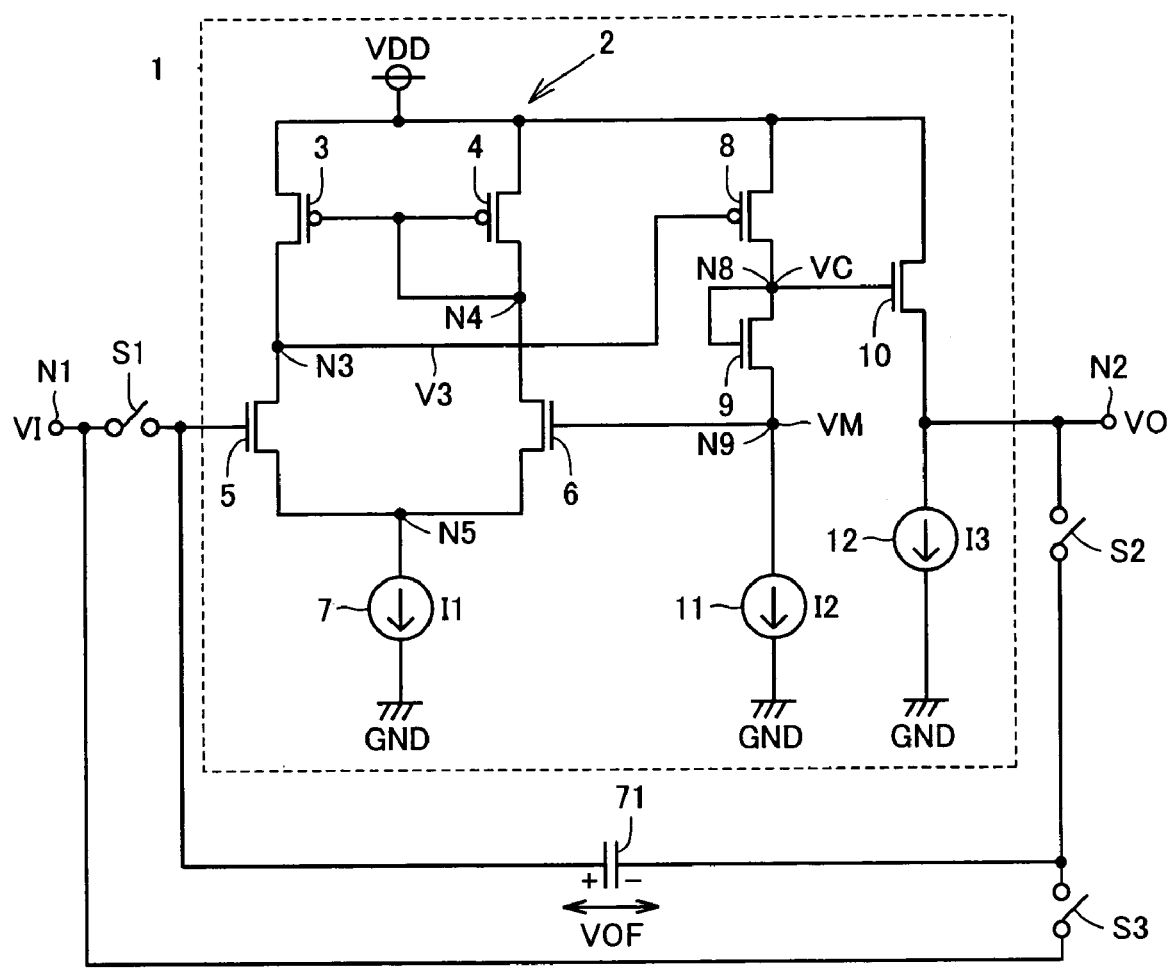
FIG. 12 is a circuit diagram showing the structure of a push type drive circuit with offset compensation capability.

FIG. 12 is a circuit diagram showing the structure of a push type drive circuit 70 with offset compensation capability according to a fourth embodiment of the present invention. In FIG. 12, push type drive circuit 70 with offset compensation capability includes a drive circuit 1, a capacitor 71 and switches S1–S3. Drive circuit 1 is the same as in FIG. 1. Capacitor 71 and switches S1–S3 define an offset compensation circuit for compensating for an offset voltage VOF, i.e. the difference between the input potential VI and the output potential VO in FIG. 1 caused by a variation in the threshold voltage of the transistors in drive circuit 1.

More specifically, switch S1 is connected between input node N1 and the gate of N-type transistor 5. Capacitor 71 and switch S2 are connected in series between the gate of N-type transistor 5 and output node N2, and switch S3 is connected between the input node N1 and a node between capacitor 71 and switch S2. Each of switches S1–S3 may be a P-type or N-type transistor, or may be provided by P-type and N-type transistors connected in parallel. Each of switches S1–S3 is on/off controlled by a control signal (not shown).

The following description illustrates the case in which the output potential VO of drive circuit 1 is lower than the input potential VI by the offset voltage VOF. In their initial state, all of switches S1–S3 are off, and when switches S1 and S2 are turned on at a certain time, the output potential VO is given by: VO=VI−VOF, and capacitor 71 is charged to the offset voltage VOF.

Next, when switches S1 and S2 are turned off, the offset voltage VOF is retained in capacitor 71. Subsequently, if switch S3 is on, the gate potential of N-type transistor 5 is given by: VI+VOF. As a result, the output potential VO of drive circuit 1 is given by: VO=VI+VOF−VOF=VI, which means that the offset voltage VOF of drive circuit 1 has been eliminated.

In the fourth embodiment, the offset voltage VOF of drive circuit 1 can be eliminated, thereby enabling the output potential VO to be precisely matched with the input potential VI.

It should be noted that the fourth embodiment illustrates the elimination of the offset potential VOF for drive circuit 1, although employing the same method can naturally eliminate the offset voltage VOF for any of drive circuits 18, 20, 25, 45, 50, 55, 61, and 65.

[Fifth Embodiment]

In drive circuit 1 of FIG. 1, the current I11 in constant current circuit 11 is set to a small value such that, when the input potential VI decreases, the decrease in the potential VC at node N8 takes time, and thus the output potential VO is decreased slowly. The fifth embodiment solves this problem.

Figure 13:
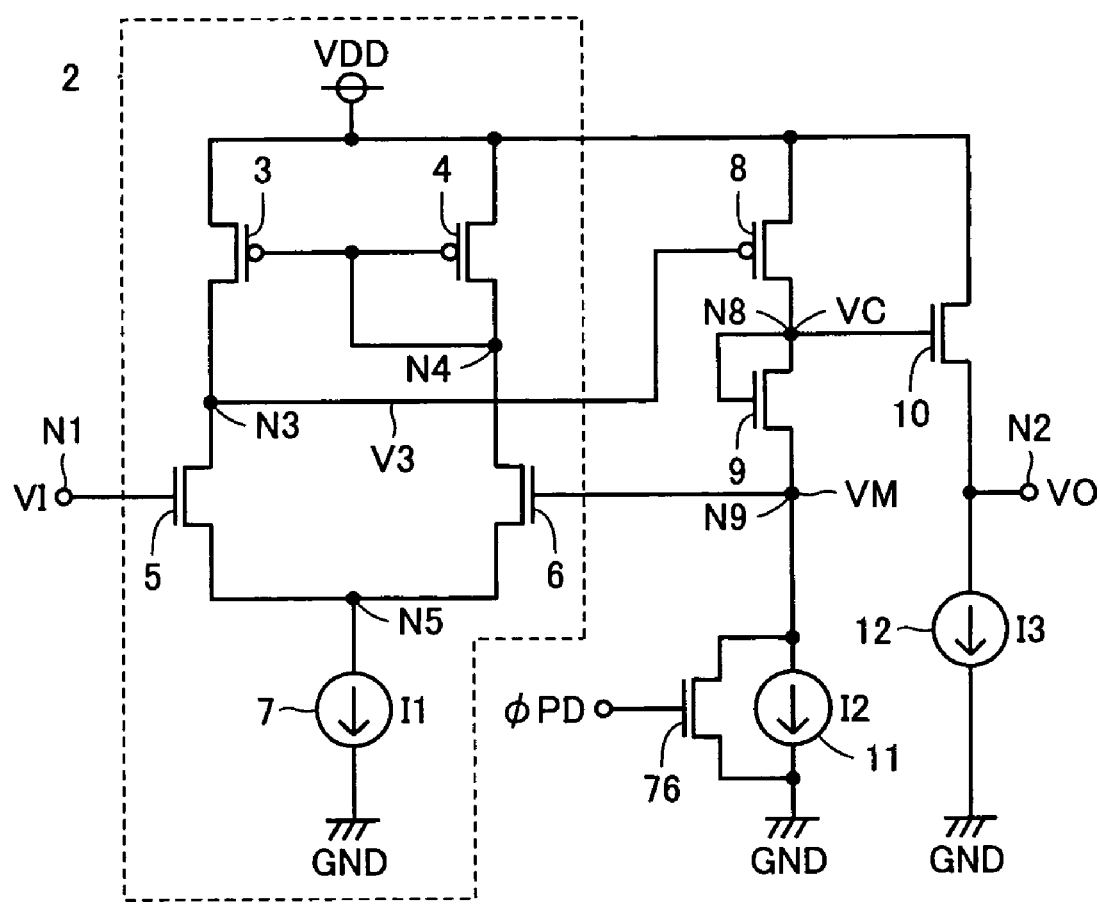
FIG. 13 is a circuit diagram showing the structure of a push type drive circuit according to a fifth embodiment of the invention.

FIG. 13 is a circuit diagram illustrating the structure of drive circuit 75 according to the fifth embodiment of the present invention. Referring to FIG. 13, drive circuit 75 is different from drive circuit 1 of FIG. 1 in that an additional N-type transistor 76 is provided. N-type transistor 76 is connected in parallel with constant current circuit 11, and has its gate receiving the signal φPD.

The signal φPD is rendered to a "high" level in a pulsing manner in response to a decrease in the input potential VI. Thus, N-type transistor 76 conducts in a pulsing manner, such that the potential VC at node N8 is decreased rapidly, which in turn rapidly decreases the output potential VO.

It should be noted that, although the fifth embodiment has the source of N-type transistor 76 connected to the ground potential GND line, it is not limited thereto and the source of N-type transistor 76 may be connected to other potential lines to decrease the potential at node N8 to a prescribed level.

Further, N-type transistor 76 may be substituted with a P-type transistor. In this case, the signal φPD needs to be rendered to a "low" level in a pulsing manner in response to a decrease in the input potential VI.

N-type transistor 76 may also be connected to constant current circuit 59 of drive circuit 55 in FIG. 9 to provide the same effect.

[Sixth Embodiment]

In drive circuit 25 of FIG. 5, the current I2 in constant current circuit 32 is set to a small value such that, when the input potential VI is increased, the increase in the potential VC at node N32 takes time and thus the output potential VO is increased slowly. The sixth embodiment attempts to solve this problem.

Figure 14:
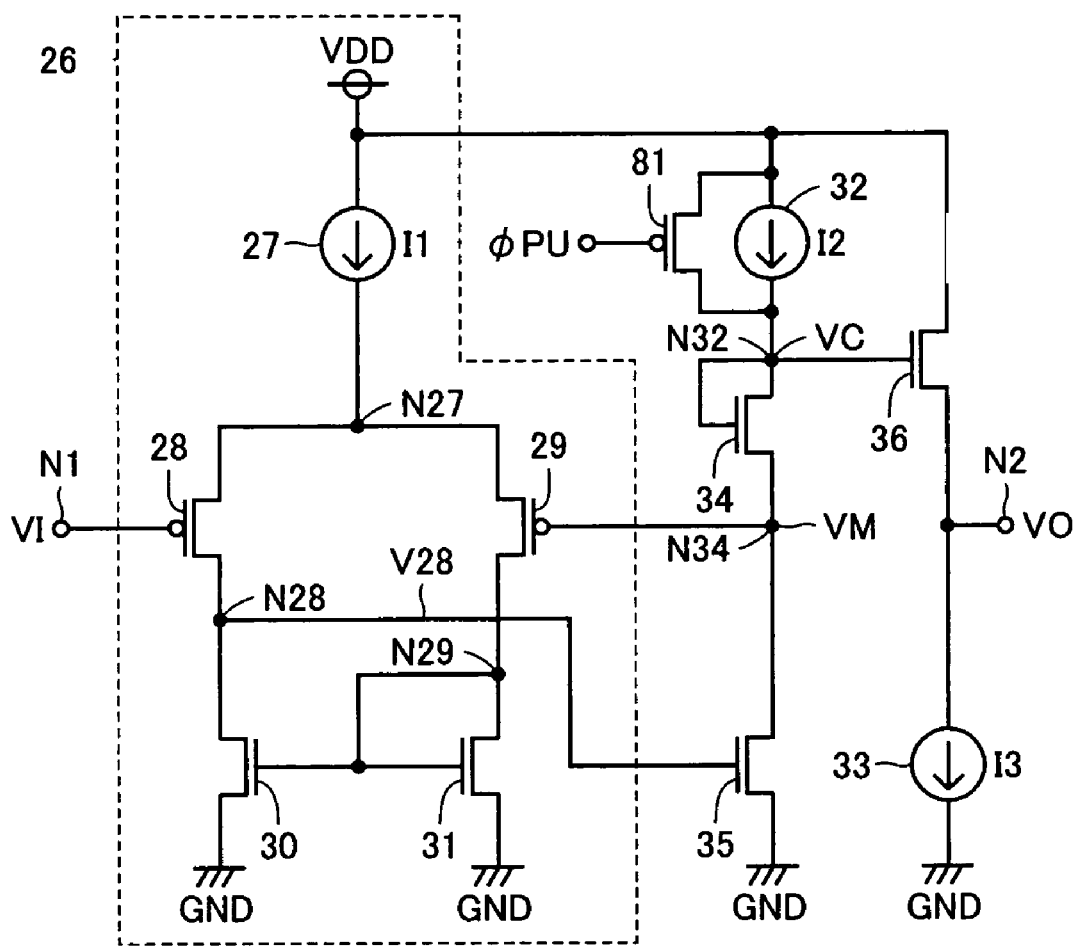
FIG. 14 is a circuit diagram showing the structure of a push type drive circuit according to a sixth embodiment of the invention.

FIG. 14 is a circuit diagram showing the structure of a drive circuit 80 according to the sixth embodiment of the present invention. Referring to FIG. 14, drive circuit 80 is different from drive circuit 25 of FIG. 5 in that an additional P-type transistor 81 is provided. P-type transistor 81 is connected in parallel with constant current circuit 32 and has its gate receiving the signal φPU. The signal φPU is rendered to a "low" level in a pulsing manner in response to an increase in the input potential VI. Thus, P-type transistor 81 conducts in a pulsing manner and the potential VC at node N32 is increased rapidly, which in turn rapidly increases the output potential VO.

It should be noted that, although the sixth embodiment has the source of P-type transistor 81 connected to the power supply potential VDD line, it is not limited thereto and the source of P-type transistor 81 may be connected to other potential lines to increase the potential at node N32 to a prescribed level.

Further, P-type transistor 81 may be substituted with an N-type transistor. In this case, the signal φPU needs to be rendered to a "high" level in a pulsing manner in response to a decrease in the input potential VI.

P-type transistor 81 may also be connected to constant current circuit 66 of drive circuit 65 in FIG. 11 to provide the same effect.

[Seventh Embodiment]

Figure 15:
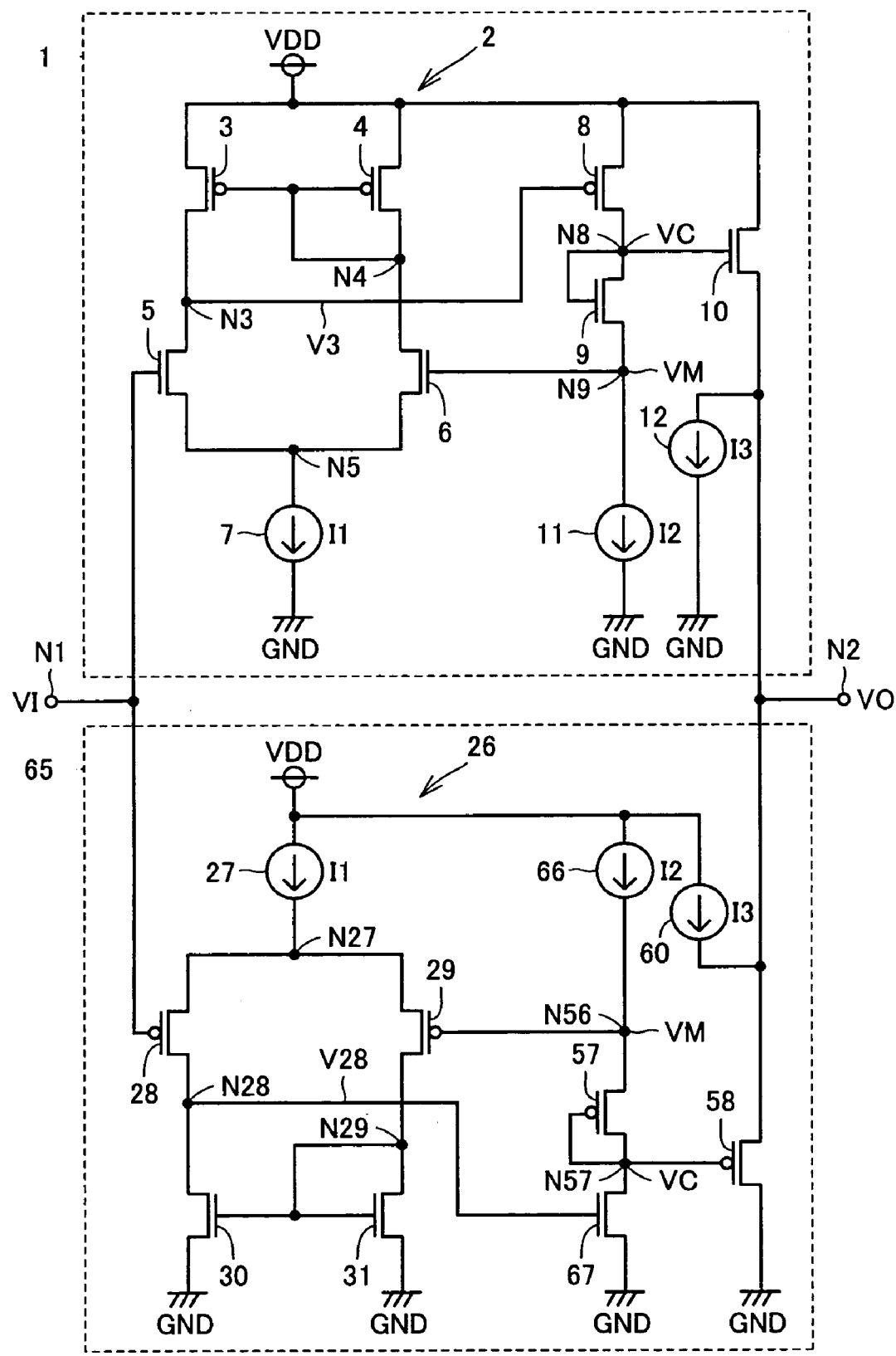
FIG. 15 is a circuit diagram showing the structure of a push-pull type drive circuit according to a seventh embodiment of the invention.

FIG. 15 is a circuit diagram showing the structure of a push-pull type drive circuit 85 according to a seventh embodiment of the present invention. In FIG. 15, drive circuit 85 is a combination of push type drive circuit 1 of FIG. 1 and pull type drive circuit 65 of FIG. 11. Input node N1 of push type drive circuit 1 is connected with input node N1 of pull type drive circuit 65, while output node N2 of push type drive circuit 1 is connected with output node N2 of pull type drive circuit 65.

When the output potential VO is higher than the input potential VI, the gate-source voltage of N-type transistor 10 in push type drive circuit 1 becomes smaller than the threshold voltage VTN of N-type transistor 10 and thus N-type transistor 10 becomes non-conductive, while the source-gate voltage of P-type transistor 58 in pull type drive circuit 65 becomes larger than the absolute value of the threshold voltage VTP of P-type transistor 58 and thus P-type transistor 58 becomes conductive, thereby reducing the output potential VO.

When the output potential VO is lower than the input potential VI, the source-gate voltage of P-type transistor 58 in push type drive circuit 1 becomes smaller than the absolute value of the threshold VTP of P-type transistor 58 and thus P-type transistor 58 becomes non-conductive, while the gate-source voltage of N-type transistor 10 of pull type drive circuit 65 becomes larger than the threshold VTN of N-type transistor 10 and thus N-type transistor 10 becomes conductive, increasing the output potential VO. Thus, VO=VI.

The seventh embodiment provides the same effect as the first embodiment and provides a large current driving capacity both when output node N2 is charged and discharged.

Figure 16:
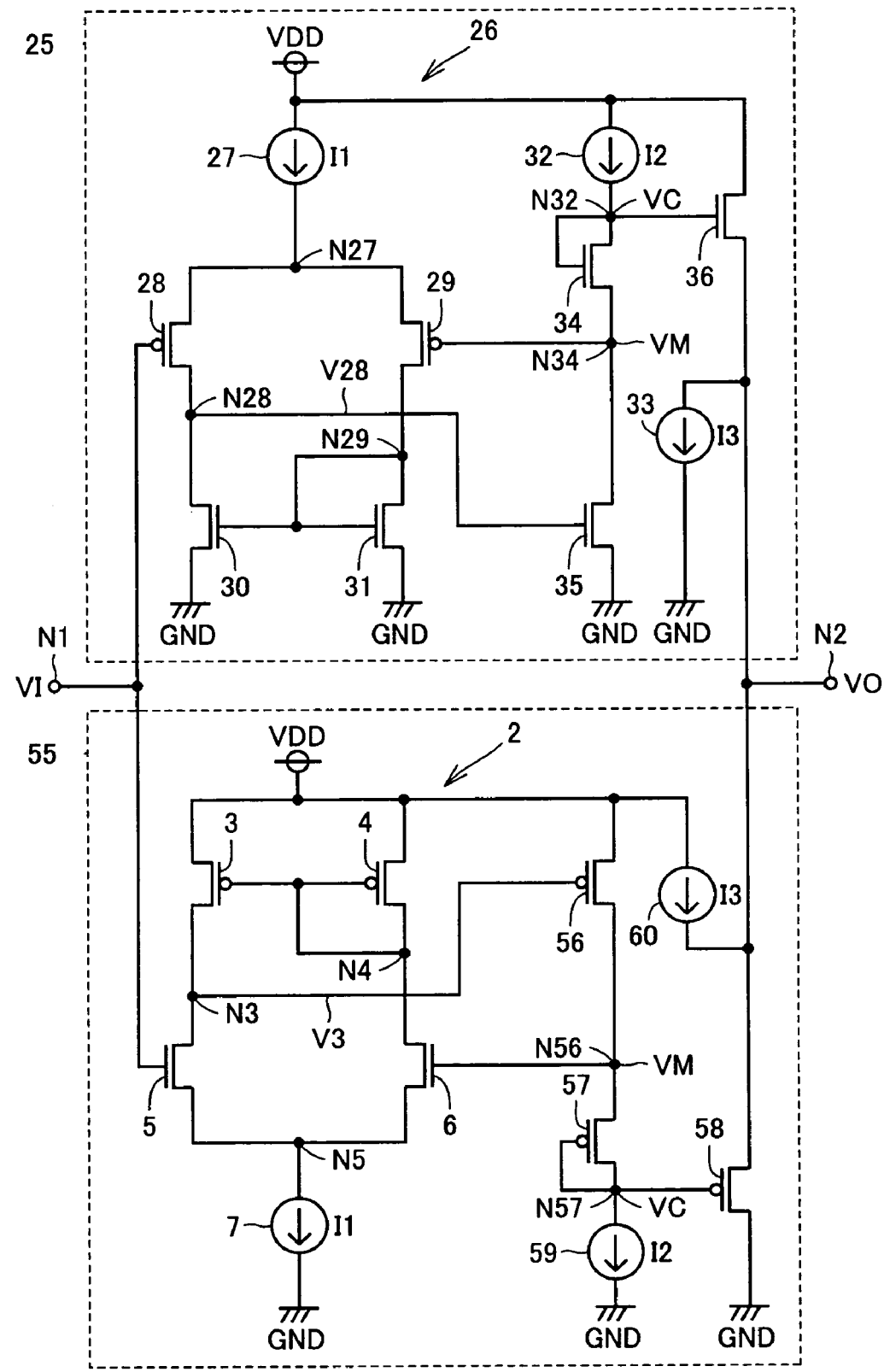
FIG. 16 is a circuit diagram showing a modification of the seventh embodiment.

Different variations of the present embodiment will now be described. Push-pull type drive circuit 90 of FIG. 16 is a combination of push type drive circuit 25 of FIG. 5 and pull type drive circuit 55 of FIG. 9. Input node N1 of push type drive circuit 25 is connected to input node N1 of pull type drive circuit 55, while output node N2 of push type drive circuit 25 is connected to output node N2 of pull type drive circuit 55. This variation also provides the same effect as drive circuit 85 of FIG. 15.

Figure 17:
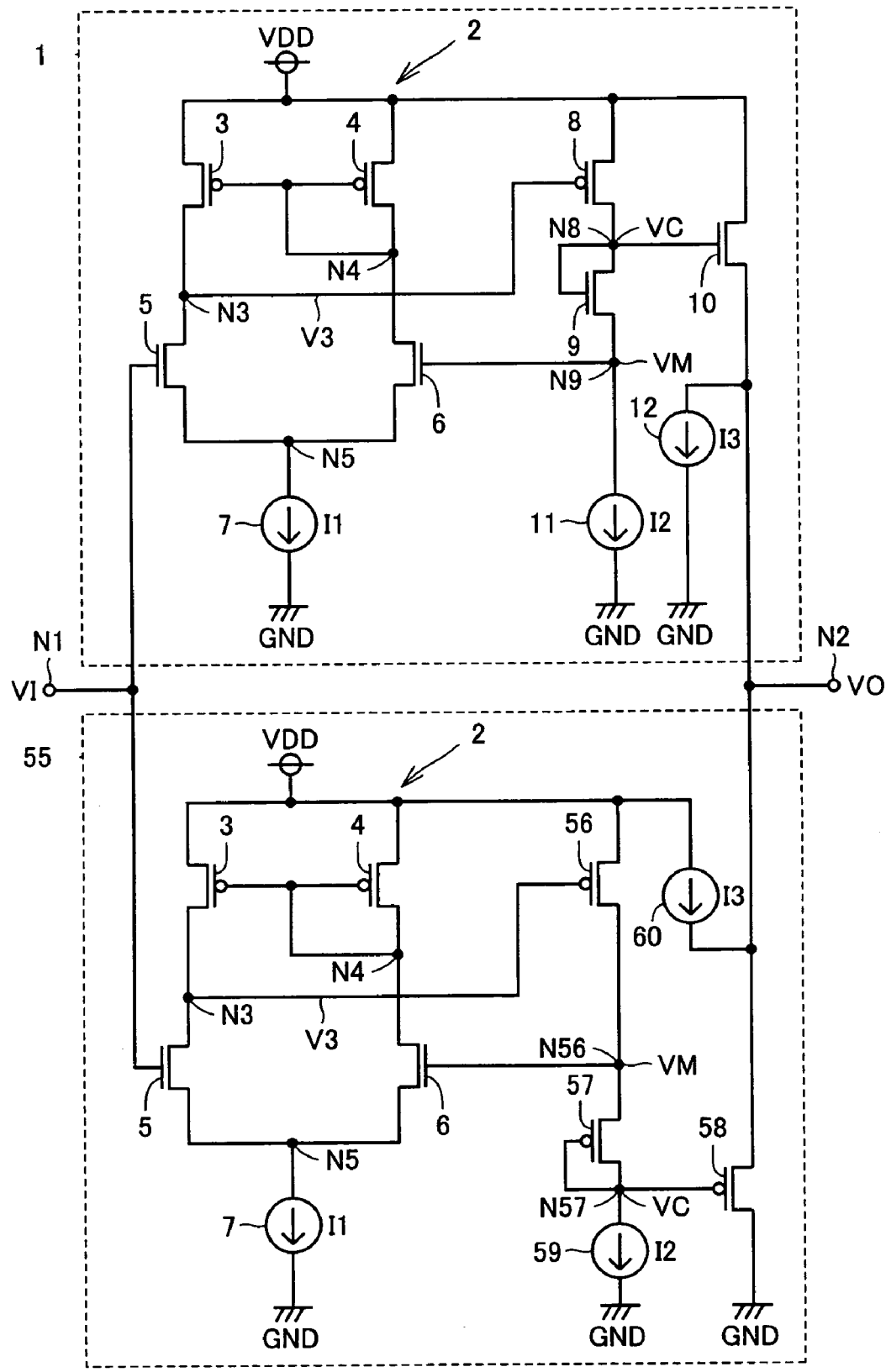
FIG. 17 is a circuit diagram showing another modification of the seventh embodiment.
Figure 18:
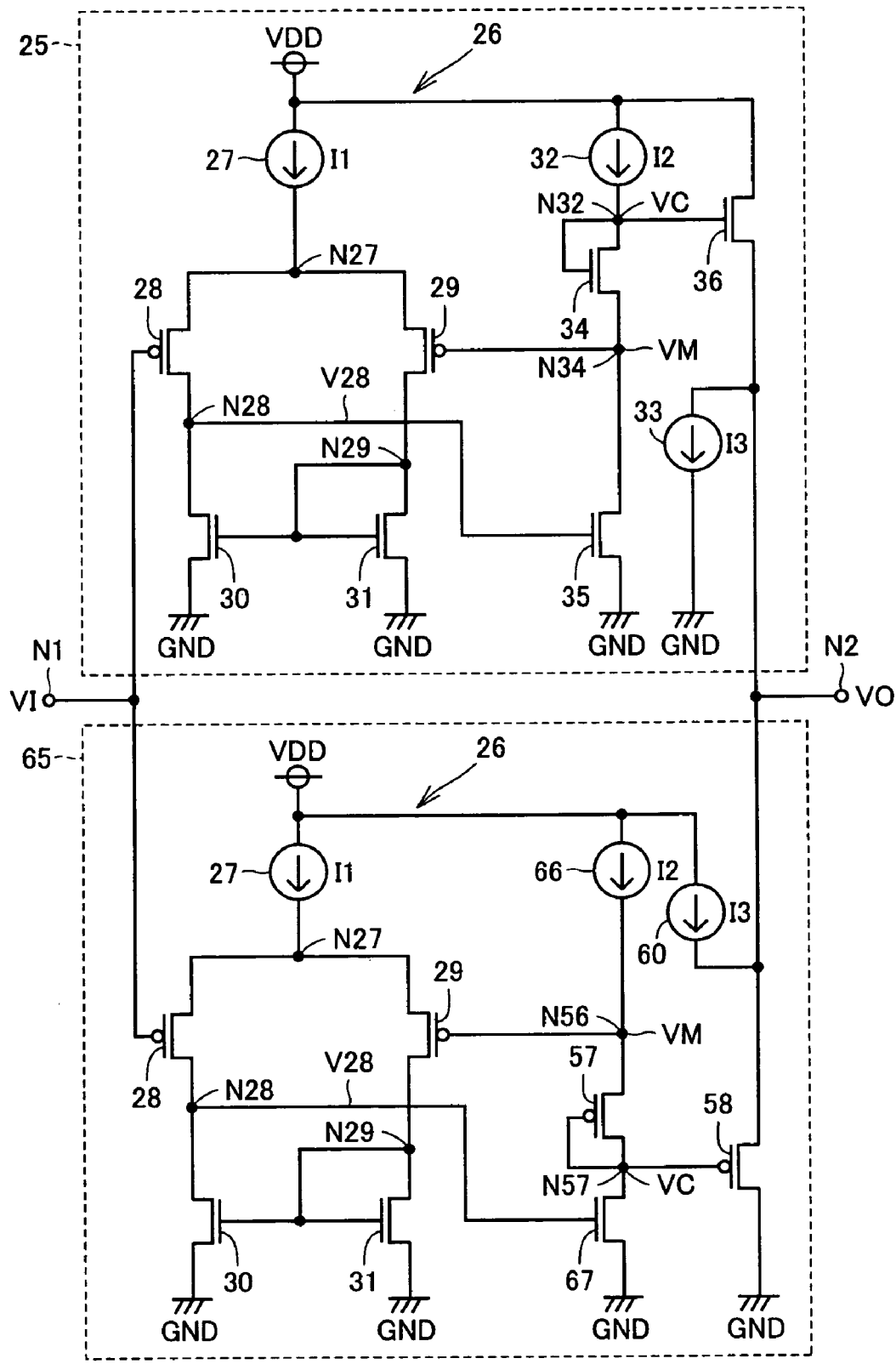
FIG. 18 is a circuit diagram showing yet another modification of the seventh embodiment.

Push-pull type drive circuit 95 of FIG. 17 is a combination of push type drive circuit 1 of FIG. 1 and pull type drive circuit 55 of FIG. 9. Push-pull type drive circuit 96 of FIG. 18 is a combination of push type drive circuit 25 of FIG. 5 and pull type drive circuit 65 of FIG. 11. These variations, too, provide the same effect as drive circuit 85 of FIG. 15.

[Eighth Embodiment]

Figure 19:
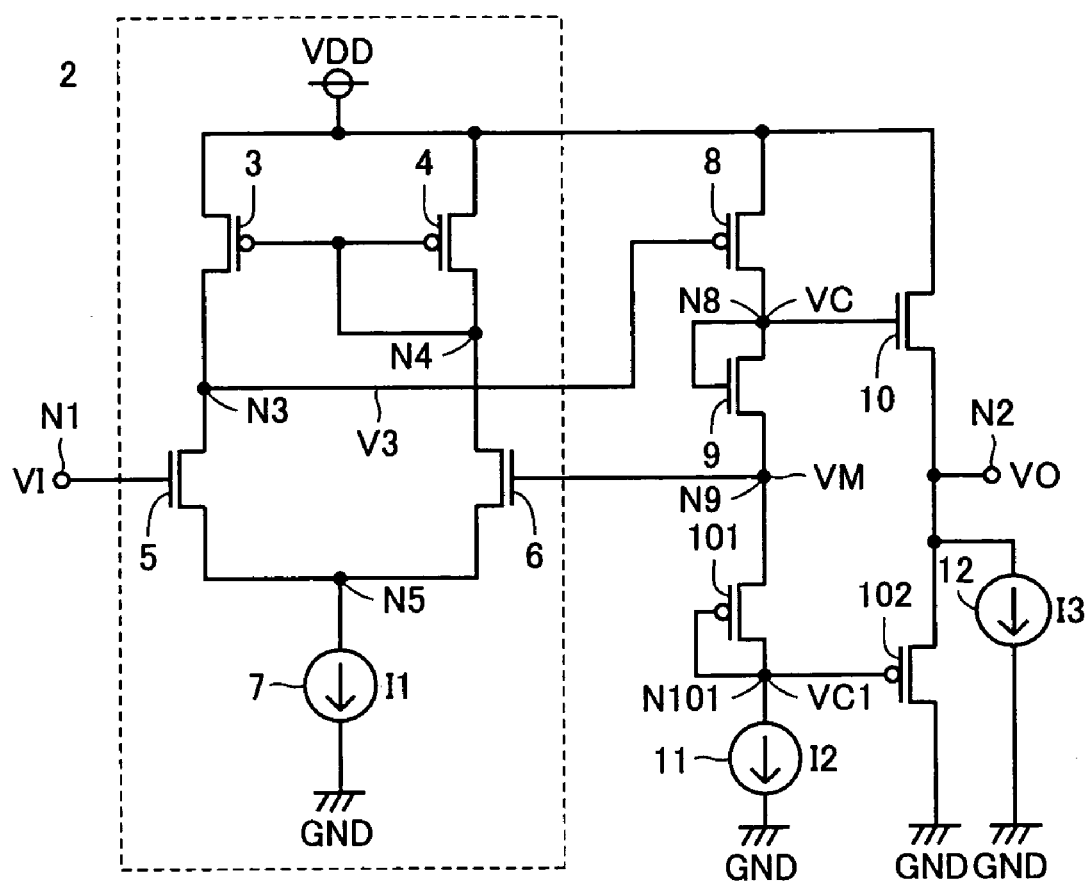
FIG. 19 is a circuit diagram showing the structure of a push-pull type drive circuit according to an eighth embodiment of the invention.

FIG. 19 is a circuit diagram showing the structure of push-pull type drive circuit 100 according to an eighth embodiment of the present invention. Referring to FIG. 19, drive circuit 100 has P-type transistors 101 and 102 added to drive circuit 1 of FIG. 1. P-type transistor 101 and constant current circuit 11 are connected in series between node 9 and a ground potential GND line, and P-type transistor 101 has its gate connected to its drain (node N101). P-type transistor 101 forms a diode. P-type transistor 102 is connected between output node N2 and a ground potential GND line, and has its gate receiving the potential VC1 at node N101.

The operation of differential amplifier 2 provides a potential at node N9, VM, that satisfies: VM=VI. Thus, the potential VC at node N8 is given by: VC=VI+VTN and the potential VC1 at node N101 is given by: VC1=VI−|VTP|. When the output potential VO is higher than the input potential VI, N-type transistor 10 becomes non-conductive while P-type transistor 102 becomes conductive. When the output potential VO is lower than the input potential VI, P-type transistor 102 becomes non-conductive while N-type transistor 10 becomes conductive. Thus, VO=VI.

The eighth embodiment provides the same effect as the seventh embodiment and provides a reduced layout area because the differential amplifiers are combined into one.

[Ninth Embodiment]

Figure 20:
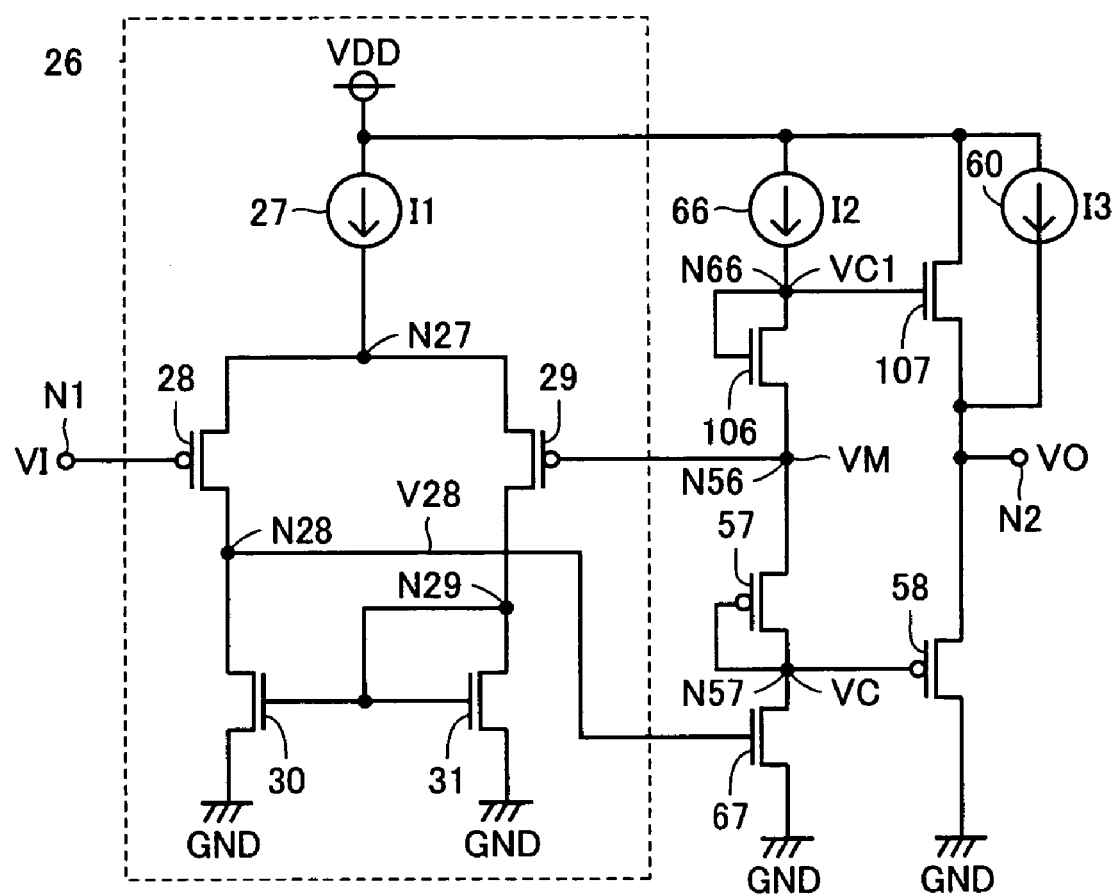
FIG. 20 is a circuit diagram showing the structure of a push-pull type drive circuit according to a ninth embodiment of the invention.

FIG. 20 is a circuit diagram showing the structure of a push-pull type drive circuit 105 according to a ninth embodiment of the present invention. Referring to FIG. 20, drive circuit 105 has N-type transistors 106 and 107 added to drive circuit 65 of FIG. 11. Constant current circuit 66 and N-type transistor 106 are connected in series between the power supply potential VDD line and node N56, and N-type transistor 106 has its gate connected to its drain (node N66). N-type transistor 106 forms a diode. N-type transistor 107 is connected between the power supply potential VDD line and output node N2, and has its gate receiving the potential VC1 at node N66. The operation of differential amplifier 26 provides a potential at node N56, VM, that satisfies: VM=VI. Accordingly, the potential VC1 at node N66 is given by: VC1=VI+VTN, while the potential VC at node N57 is given by: VC=VI−|VTP|. When the output potential VO is higher than the input potential VI, N-type transistor 107 becomes non-conductive, while P-type transistor 58 becomes conductive. When the output potential VO is lower than the input potential VI, P-type transistor 58 becomes non-conductive while N-type transistor 107 becomes conductive. Thus, VO=VI.

The ninth embodiment also provides the same effect as the eighth embodiment.

[Tenth Embodiment]

Figure 21:
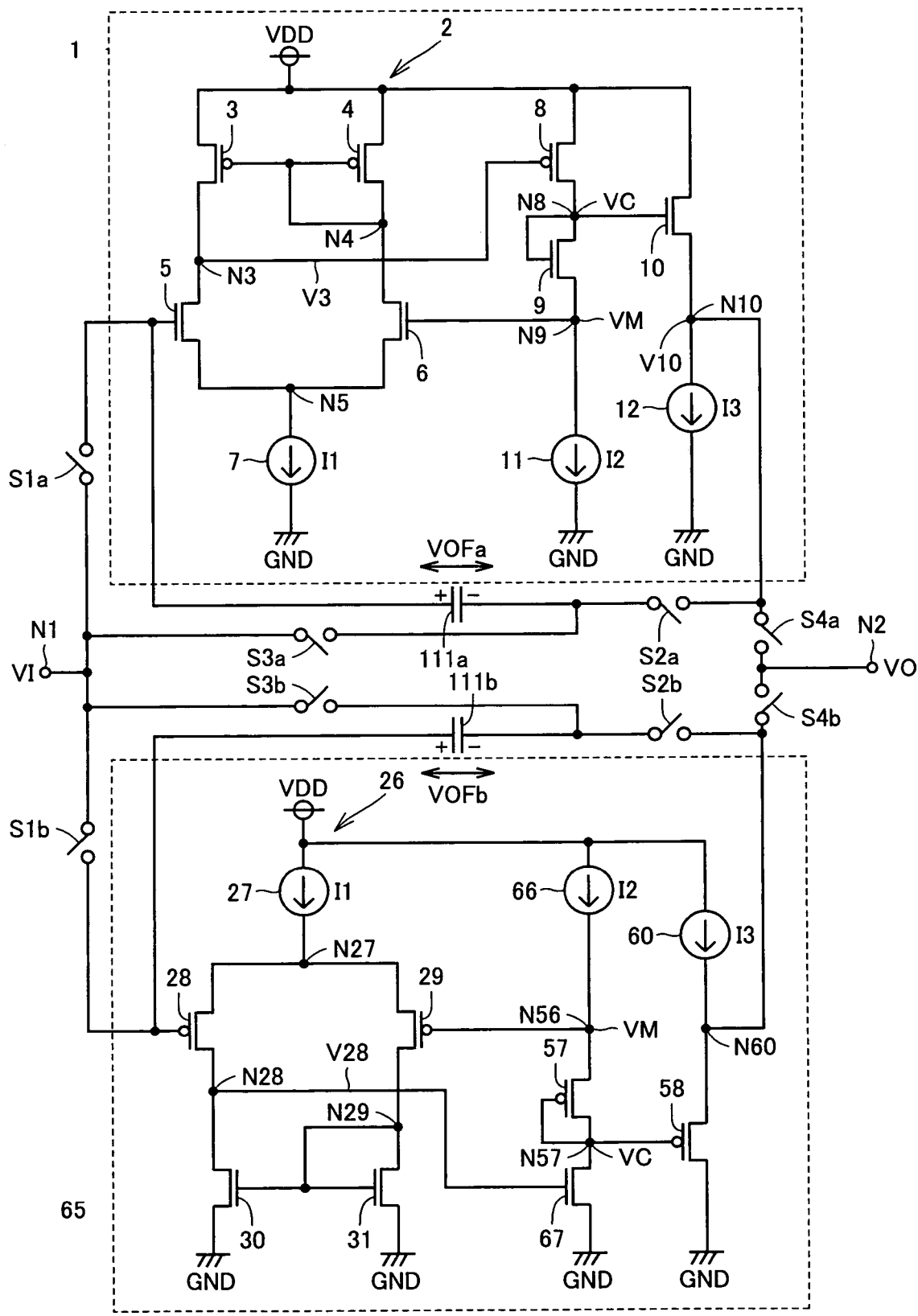
FIG. 21 is a circuit diagram showing the structure of a push-pull type drive circuit with offset compensation capability according to a tenth embodiment of the invention.
Figure 22:
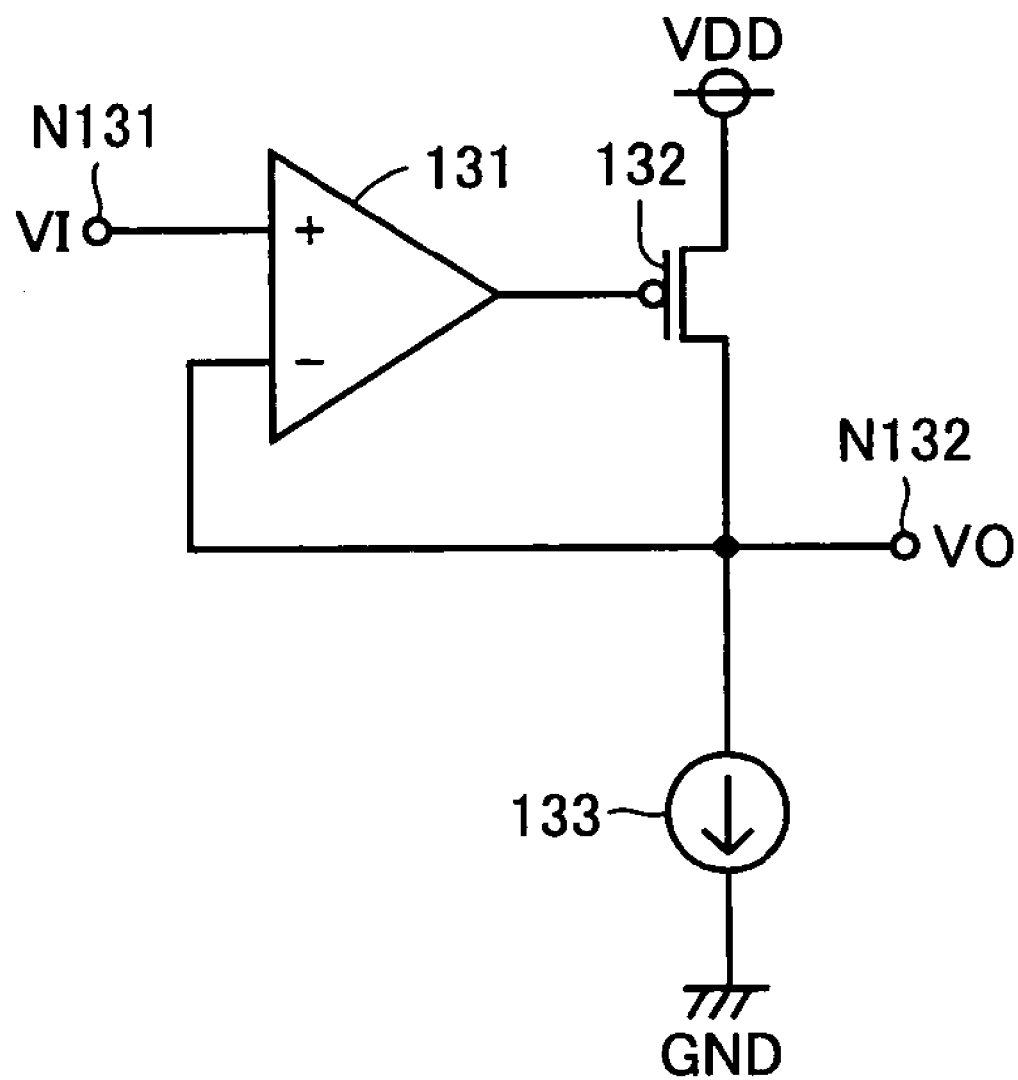
FIG. 22 is a circuit diagram showing the structure of a conventional drive circuit.

FIG. 21 is a circuit diagram showing the structure of push-pull type drive circuit 110 with offset compensation capability according to a tenth embodiment of the present invention. In FIG. 21, drive circuit 110 includes drive circuit 1 of FIG. 1, drive circuit 65 of FIG. 11, capacitors 111a and 111b, switches S1a–S4a, and S1b–S4b.

Switches S1a and S1b are connected between input node N1 and the gates of N-type transistor 5 and P-type transistor 28 of drive circuits 1 and 65, respectively. Capacitor 111a and switch S2a are connected in series between the gate of N-type transistor 5 of drive circuit 1 and the source of N-type transistor 10 (node N10). Capacitor 111b and switch S2b are connected in series between the gate of P-type transistor 28 of drive circuit 65 and the source of P-type transistor 58 (node N60). Switch S3a is connected between input node N1 and a node between capacitor 111a and switch S2a. Switch S3b is connected between input node N1 and a node between capacitor 111b and switch S2b. Switches S4a and S4b are connected between respective nodes, N10 and N60, and output node N2.

The operation of drive circuit 110 will now be described. In their initial state, all of switches S1a–S4a and S1b–S4b are off. When switches S1a, S2a, S1b, and S2b are turned on at a certain time, the potentials V10 and V60 at nodes N16 and N60 are given by: V10=VI−VOFa and V60=VI−VOFb, respectively, and capacitors 111a, 111b are charged to their respective offset voltages VOFa and VOFb.

Then, when switches S1a, S2a, S1b, and S2b are turned off, the offset voltages VOFa, VOFb are retained in capacitors 111a and 111b, respectively. Then, when switches S3a, S3b are turned on, the gate voltages of N-type transistor 5 and P-type transistor 28 of drive circuits 1, 65 are given by: VI+VOFa and VI+VOFb, respectively. As a result, the output potentials V10, V60 of their respective drive circuits 1, 65 are given by: V10=VI+VOFa−VOFa=VI and V60=VI+VOFb−VOFb=VI, thereby eliminating the offset voltages VOFa, VOFb of their respective drive circuits 1, 65. Finally, switches S4a, S4b are turned on such that VO=VI.

The tenth embodiment provides a drive circuit 110 with no offset voltage and of high current driving capacity during charging and discharging.

It should be understood that the disclosed embodiments are, in all respects, by way of illustration and example only and are not by way of limitation. The scope of the present invention is set forth by the claims rather than the above description and is intended to include all the modifications within the spirit and scope equivalent to those of the claims.

What is claimed is:

1. A drive circuit outputting to an output node a potential corresponding to an input potential, comprising:
   a first sub-drive circuit including:
   a first transistor of a first conductivity type connected between a first power supply potential line and a first node;
   a second transistor of the first conductivity type having a gate and a first electrode connected to a gate of said first transistor, and a second electrode connected to a second node;
   a third transistor connected in series with said second transistor between second and third power supply potentials lines; and
   a first differential amplifier for regulating a gate potential of said third transistor to match a potential at said second node with said input potential;

a second sub-drive circuit including: a fourth transistor of a second conductivity type connected between a fourth power supply potential line different from said first power supply potential and a third node;

a fifth transistor of a second conductivity type having a gate and a first electrode connected to a gate of said fourth transistor, and a second electrode connected to a fourth node;

a sixth transistor connected in series with said fifth transistor between said second and third power supply potential lines; and a second differential amplifier for regulating a gate potential of said sixth transistor to match a potential at said fourth node with said input potential;

a first offset compensation circuit for eliminating an offset voltage of said first sub-drive circuit and connecting said first node to said output node; and a second offset compensation circuit for eliminating an offset voltage of said second sub-drive circuit and connecting said third node to said output node.

2. The drive circuit according to claim 1, wherein said third transistor is connected between said second power supply potential line and the first electrode of said second transistor, said first sub-drive circuit further includes a current limiting element connected between said second node and said third power supply potential line.

3. The drive circuit according to claim 2, wherein said first sub-drive circuit further includes a switching element connected in parallel with said current limiting element to conduct in a pulsing manner with prescribed timing.

4. The drive circuit according to claim 1, wherein said third transistor is connected between said second node and said third power supply potential line, said first sub-drive circuit further includes a current limiting element connected between said second power supply potential line and the first electrode of said second transistor.

5. The drive circuit according to claim 4, wherein said first sub-drive circuit further includes a switching element connected in parallel with said current limiting element to conduct in a pulsing manner with prescribed timing.

6. The drive circuit according to claim 1, wherein said third transistor is connected between said second power supply potential line and the first electrode of said second transistor, said sixth transistor is connected between said third power supply potential line and the first electrode of said fifth transistor, said first sub-drive circuit further includes: a first current limiting element connected between said second node and said third power supply potential line, and said second sub-drive circuit further includes a second current limiting element connected between said fourth node and said second power supply potential line.

7. The drive circuit according to claim 1, wherein said third transistor is connected between said second node and said third power supply potential line, said sixth transistor is connected between said fourth node and said second power supply potential line, said first sub-drive circuit further includes: a first current limiting element connected between said second power supply potential line and the first electrode of said second transistor, and said second sub-drive circuit further includes a second current limiting element connected between said third power supply potential line and the first electrode of said fifth transistor.

8. The drive circuit according to claim 1, wherein said third transistor is connected between said second power supply potential line and the first electrode of said second transistor, said sixth transistor is connected between said fourth node and said second power supply potential line, said first sub-drive circuit further includes a first current limiting element connected between said second node and said third power supply potential line, and said second sub-drive circuit further includes a second current limiting element connected between said third power supply potential line and the first electrode of said fifth transistor.

9. The drive circuit according to claim 1, wherein said first offset compensation circuit includes:

a first current limiting element connected between said first node and a sixth power supply potential line;

a first capacitor;

a first switching circuit for providing said input potential to one electrode of said first capacitor and connecting the other electrode of said first capacitor to said first node;

a second switching circuit for providing said input potential to the other electrode of said first capacitor and providing, instead of said input potential, a potential of the one electrode of said first capacitor to said first differential amplifier; and a third switching circuit for providing a potential at said first node to said output node, and said second offset compensation circuit includes:

a second current limiting element connected between said third node and a seventh power supply potential line;

a second capacitor;

a fourth switching circuit for providing said input potential to one electrode of said second capacitor and connecting the other electrode of said second capacitor to said third node;

a fifth switching circuit for providing said input potential to the other electrode of said second capacitor and providing, instead of said input potential, a potential of the other electrode of said second capacitor to said second differential amplifier; and a sixth switching circuit for providing a potential at said third node to said output node.

10. The drive circuit according to claim 1, wherein said first differential amplifier includes:

seventh and eighth transistors having gates receiving the input potential and a potential at said second node, respectively, and first electrodes connected to each other;

ninth and tenth transistors of a conductivity type different from that of said seventh and eighth transistors, connected between a fourth power supply potential line and second electrodes of said seventh and eighth transistors, respectively, and having gates connected to the second electrode of said eighth transistor; and a current limiting element connected between the first electrodes of said seventh and eighth transistors and a fifth power supply potential line.

11. The drive circuit according to claim 10, wherein said first, second and fourth power supply potentials are the same potential, and said third and fifth power supply potentials are the same potential.

12. The drive circuit according to claim 10, wherein said first, second and fifth power supply potentials are the same potential, and said third and fourth power supply potentials are the same potential.

13. The drive circuit according to claim 1, wherein said first differential amplifier includes:

seventh and eighth transistors having gates receiving said input potential and a potential at said second node, respectively, and first electrodes connected to each other;

first and second resistors connected between a fourth power supply potential line and second electrodes of said seventh and eighth transistors, respectively; and a current limiting element connected between the first electrodes of said seventh and eighth transistors, respectively, and a fifth power supply potential line.

14. The drive circuit according to claim 1, wherein each of said first to sixth transistors is a thin film transistor.

* * * * *